US008981368B2

(12) United States Patent
Shimayama et al.

(10) Patent No.: US 8,981,368 B2
(45) Date of Patent: Mar. 17, 2015

(54) THIN FILM TRANSISTOR, METHOD OF MANUFACTURING THIN FILM TRANSISTOR, DISPLAY, AND ELECTRONIC APPARATUS

(71) Applicant: Sony Corporation, Tokyo (JP)

(72) Inventors: Tsutomu Shimayama, Kanagawa (JP); Nobutoshi Fujii, Kanagawa (JP); Takashige Fujimori, Kanagawa (JP)

(73) Assignee: Sony Corporation (JP)

( * ) Notice: Subject to any disclaimer, the term of this patent is extended or adjusted under 35 U.S.C. 154(b) by 39 days.

(21) Appl. No.: 13/732,948

(22) Filed: Jan. 2, 2013

(65) Prior Publication Data

US 2013/0175522 A1 Jul. 11, 2013

(30) Foreign Application Priority Data

Jan. 11, 2012 (JP) ................................. 2012-003211
Feb. 9, 2012 (JP) ................................. 2012-026250

(51) Int. Cl.

*H01L 29/10* (2006.01)
*H01L 29/12* (2006.01)
*H01L 21/00* (2006.01)
*H01L 21/16* (2006.01)
*H01L 29/786* (2006.01)
*H01L 27/15* (2006.01)
*H01L 29/66* (2006.01)

(52) U.S. Cl.

CPC .......... *H01L 29/78693* (2013.01); *H01L 27/15* (2013.01); *H01L 29/66969* (2013.01); *H01L 29/66742* (2013.01); *H01L 29/78606* (2013.01); *H01L 29/78618* (2013.01)

USPC ...................... 257/43; 257/E29.296; 438/104

(58) Field of Classification Search

USPC ............................................ 257/43; 438/104

See application file for complete search history.

(56) References Cited

U.S. PATENT DOCUMENTS

2007/0072439 A1* 3/2007 Akimoto et al. .............. 438/795
2008/0303020 A1* 12/2008 Shin et al. ....................... 257/43
2010/0065840 A1* 3/2010 Yamazaki et al. .............. 257/43

FOREIGN PATENT DOCUMENTS

JP 2008-60419 A 3/2008
JP 2010-16163 A 1/2010

OTHER PUBLICATIONS

Kilic et al., "n-type doping of oxides by hydrogen", Applied Physics Letters, vol. 81, No. 1, American Institute of Physics, Jul. 1, 2002, 3 pages.

* cited by examiner

*Primary Examiner* — William F Kraig
*Assistant Examiner* — Khaja Ahmad
(74) *Attorney, Agent, or Firm* — Sheridan Ross P.C.

(57) ABSTRACT

A thin film transistor includes: a gate electrode, a source electrode, and a drain electrode; an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

20 Claims, 22 Drawing Sheets

710
720
730
740
750
760
770

THIN FILM TRANSISTOR, METHOD OF MANUFACTURING THIN FILM TRANSISTOR, DISPLAY, AND ELECTRONIC APPARATUS

BACKGROUND

The present disclosure relates to a thin film transistor (TFT), a method of manufacturing the thin film transistor, a display, and an electronic apparatus.

It is known that an oxide (an oxide semiconductor) of zinc (Zn), indium (In), gallium (Ga), tin (Sn), or a mixture thereof exhibits excellent semiconductor property. For example, a thin film transistor using an oxide semiconductor exhibits electron mobility ten or more times that of a thin film transistor using amorphous silicon, and exhibits favorable off characteristics. Therefore, it is expected that the thin film transistor using an oxide semiconductor is applied to a drive device for a liquid crystal display or an organic electro luminescence (EL) display with a large screen, high definition, and a high frame rate (see Japanese Unexamined Patent Application Publication No. 2010-016163).

However, the oxide semiconductor has insufficient heat resistance. Thus, oxygen desorption occurs due to heat treatment or plasma treatment in processes of manufacturing the thin film transistor, and lattice defect is accordingly formed. The lattice defect causes formation of electrically shallow impurity level and reduction in resistance of the oxide semiconductor. Therefore, when the oxide semiconductor is used in an active layer, a threshold voltage is decreased due to increase in defect level, and leakage current is increased. Accordingly, so-called depression operation in which a drain current flows even when a gate current is not applied may occur. Further, if the defect level is continuously increased, the operation is shifted from a transistor operation to a conductor operation. It is assumed to be due to change in stability depending on content ratio of thermally-unstable elements particularly in the case of a multi-elemental oxide semiconductor. Moreover, hydrogen has been reported as an element forming shallow impurity level in addition to the lattice defect ("n-type doping of oxides by hydrogen", Cetin Kilic, et al., APPLIED PHYSICS LETTERS, Jul. 1, 2002, Vol. 81, No. 1, pp. 73-75).

In addition, oxide semiconductors such as zinc oxide and indium gallium zinc oxide (IGZO) have excellent semiconductor property, and application to a thin film transistor (TFT) and the like is under consideration. The thin film transistor using an oxide semiconductor has large electron mobility and excellent electric characteristics compared with a thin film transistor using amorphous silicon. Moreover, the thin film transistor using an oxide semiconductor has favorable off characteristics, and is expected to have high mobility even at temperature near room temperature.

However, the oxide semiconductor has insufficient heat resistance. Thus, when the oxide semiconductor is applied to a thin film transistor, desorption of oxygen, zinc, and the like occurs to form lattice defect in a heat treatment process in manufacturing the thin film transistor. The lattice defect causes formation of electrically shallow impurity level and reduction in resistance of the oxide semiconductor.

Therefore, it is proposed that a protection layer formed of an insulating material is provided on an oxide semiconductor layer to suppress desorption of oxygen and the like from the oxide semiconductor layer (for example, see Japanese Unexamined Patent Application Publication No. 2008-60419).

SUMMARY

As described above, in the thin film transistor using an oxide semiconductor, the characteristics of the oxide semiconductor is deteriorated in the manufacturing process, and the deterioration is likely to affect electric characteristics. Therefore, prevention of deterioration in characteristics of the oxide semiconductor and improvement in electric characteristics are desired.

Accordingly, it is desirable to provide a thin film transistor, a method of manufacturing the thin film transistor, a display, and an electronic apparatus which are capable of achieving improvement of electric characteristics.

In addition, as in the configuration disclosed in Japanese Unexamined Patent Application Publication No. 2008-60419, when a protection layer is formed on an oxide semiconductor layer, it is concerned that the oxide semiconductor layer is damaged at the time of forming the protection layer. Moreover, when a source-drain electrode layer is formed on the protection layer (an insulating layer), the oxide semiconductor layer is not allowed to make contact with the electrode layer. Accordingly, it is necessary to form a contact hole in the protection layer before formation of the electrode layer. Thus, the number of processes is disadvantageously increased, and it is concerned that the oxide semiconductor is damaged in processing. If the oxide semiconductor layer is damaged, the characteristics of the thin film transistor are deteriorated to lower a manufacturing yield.

Accordingly, it is desirable to provide a thin film transistor having a configuration that prevents the semiconductor layer from being damaged in manufacturing, has high reliability, and is manufactured with high yield, and to provide a method of manufacturing such a thin film transistor. In addition, it is desirable to provide a display including the thin film transistor.

According to an embodiment of the disclosure, there is provided a first thin film transistor including: a gate electrode, a source electrode, and a drain electrode; an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

In the first thin film transistor according to the embodiment of the disclosure, the oxide semiconductor layer is provided in the region not facing the source electrode and the drain electrode. The low resistance oxide layer is provided in the regions facing each of the source electrode and the drain electrode and adjacent to the oxide semiconductor layer. Therefore, in manufacturing processes, the oxide semiconductor layer (a channel layer) is allowed to be formed after the formation of the source electrode and the drain electrode. In the oxide semiconductor, desorption of oxygen occurs due to damage inflicted at the time of formation or patterning of the electrode, thereby causing lattice defect. However, when the oxide semiconductor layer is formed after the formation of the electrode described above, occurrence of such lattice defect is suppressed, and thus deterioration of the oxide semiconductor layer is prevented. In addition, the low resistance oxide layer provided adjacent to the oxide semiconductor layer ensures favorable electrical connection between the oxide semiconductor layer and the source electrode and between the oxide semiconductor layer and the drain electrode.

According to an embodiment of the disclosure, there is provided a first method of manufacturing a thin film transistor. The method includes: forming each of a gate electrode, a source electrode, and a drain electrode; and forming an oxide semiconductor layer, the oxide semiconductor layer being provided on one side of the gate electrode with an insulating film in between, the oxide semiconductor layer being provided in a region not facing the source electrode and the drain electrode and being electrically connected to the source electrode and the drain electrode, the forming the oxide semiconductor layer including forming a low resistance oxide layer, the low resistance oxide layer being provided in a region facing the source electrode and in a region facing the drain electrode, the regions being adjacent to the oxide semiconductor layer, and the low resistance oxide layer having an electric resistivity lower than an electric resistivity of the oxide semiconductor layer.

In the first method of manufacturing the thin film transistor according to the embodiment of the disclosure, in formation of the oxide semiconductor layer, the oxide semiconductor layer is formed in the region not facing the source electrode and the drain electrode, and the low resistance oxide layer is formed in the regions facing each of the source electrode and the drain electrode and adjacent to the oxide semiconductor layer. Accordingly, the oxide semiconductor layer (a channel layer) is allowed to be formed after the formation of the source electrode and the drain electrode. In the oxide semiconductor, desorption of oxygen occurs due to damage inflicted at the time of formation or patterning of the electrode, thereby causing lattice defect. However, when the oxide semiconductor layer is formed after the formation of the electrode described above, occurrence of such lattice defect is suppressed, and thus deterioration of the oxide semiconductor layer is prevented. In addition, the low resistance oxide layer provided adjacent to the oxide semiconductor layer ensures favorable electrical connection between the oxide semiconductor layer and the source electrode and between the oxide semiconductor layer and the drain electrode.

According to an embodiment of the disclosure, there is provided a first display with a thin film transistor. The thin film transistor includes: a gate electrode, a source electrode, and a drain electrode; an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

According to an embodiment of the disclosure, there is provided an electronic apparatus with a display being provided with a thin film transistor. The thin film transistor includes: a gate electrode, a source electrode, and a drain electrode; an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

According to an embodiment of the disclosure, there is provided a second thin film transistor including: a gate electrode; a semiconductor layer including an oxide semiconductor and forming a channel; a gate insulating layer provided between the gate electrode and the semiconductor layer; an electrode layer serving as source-drain electrodes of the transistor; a first protection film provided between the semiconductor layer and the electrode layer, the first protection film including a coarse insulating material; and a second protection film provided in contact with a portion of the semiconductor layer, the portion not facing the electrode layer, and the second protection film including an insulating material that is more dense than the coarse insulating material of the first protection film.

According to an embodiment of the disclosure, there is provided a second method of manufacturing a thin film transistor. The method includes: forming a gate electrode; forming a gate insulating layer on the gate electrode; forming a semiconductor layer formed of an oxide semiconductor on the gate insulating layer; forming a protection film formed of a coarse insulating material on the semiconductor layer; forming an electrode layer on the protection film; forming an opening on the electrode layer to form source-drain electrodes; and introducing oxygen to the protection film in a part under the opening to form a first protection film and a second protection film, the first protection film being not introduced with oxygen, the second protection film being introduced with oxygen.

According to an embodiment of the disclosure, there is provided a second display with a display device and a thin film transistor. The thin film transistor drives the display device. The thin film transistor includes: a gate electrode; a semiconductor layer including an oxide semiconductor and forming a channel; a gate insulating layer provided between the gate electrode and the semiconductor layer; an electrode layer serving as source-drain electrodes of the transistor; a first protection film provided between the semiconductor layer and the electrode layer, the first protection film including a coarse insulating material; and a second protection film provided in contact with a portion of the semiconductor layer, the portion not facing the electrode layer, and the second protection film including an insulating material that is more dense than the coarse insulating material of the first protection film.

According to the second thin film transistor of the embodiment of the disclosure, the first protection film formed of a coarse insulating material is provided between the semiconductor layer and the electrode layer of the source-drain electrodes. Therefore, in the first protection film formed of the coarse insulating material, leakage occurs due to a tunnel current. Accordingly, sufficient conduction between the semiconductor layer and the electrode layer of the source-drain electrodes is possible. In addition, in a portion not facing the electrode layer of the semiconductor layer, there is formed the second protection film formed of a dense insulating material compared with the material of the first protection film. Therefore, the portion of the semiconductor layer is protected by the second protection film and is insulated sufficiently.

In the second method of manufacturing the thin film transistor of the embodiment of the disclosure, the protection film formed of a coarse insulating material is formed on the semiconductor layer formed of an oxide semiconductor, and the electrode layer is formed on the protection film. Therefore, the semiconductor layer is protected by the protection film in formation of the electrode layer. In addition, since the protection film is formed of a coarse insulating material, conduction between the semiconductor layer and the electrode layer is possible. Furthermore, the opening is formed in the electrode layer, and oxygen is introduced to the protection film in a part under the opening to form the first protection film not introduced with oxygen and the second protection film introduced with oxygen. Therefore, the second protection film becomes dense by the induced oxygen and thus has sufficient insulating property. As a result, the second protection film insulates the semiconductor layer at a part under the second protection film, and insulates the electrode layer on both sides of the opening.

In the second display of the embodiment of the disclosure, the thin film transistor driving a display device has the configuration of any of the thin film transistors of the embodiments of the disclosure. Therefore, in the thin film transistor, it is possible to realize conduction between the semiconductor layer and the electrode layer, and to protect and insulate the other portions of the semiconductor layer sufficiently.

According to the first thin film transistor of the embodiment of the disclosure, the oxide semiconductor layer is provided in the region not facing the source electrode and the drain electrode. The low resistance oxide layer is provided in the regions facing each of the source electrode and the drain electrode and adjacent to the oxide semiconductor layer. Therefore, deterioration of the oxide semiconductor layer is prevented in manufacturing processes. In addition, favorable electrical connection between the oxide semiconductor layer and the source electrode and between the oxide semiconductor layer and the drain electrode is ensured by the low resistance oxide layer. Consequently, it is possible to achieve improvement of electric characteristics.

According to the first method of manufacturing the thin film transistor of the embodiment of the disclosure, the oxide semiconductor layer is formed in the region not facing the source electrode and the drain electrode, and the low resistance oxide layer is formed in the regions facing each of the source electrode and the drain electrode and adjacent to the oxide semiconductor layer. Accordingly, deterioration of the oxide semiconductor layer is prevented. In addition, favorable electrical connection between the oxide semiconductor layer and the source electrode and between the oxide semiconductor layer and the drain electrode is ensured by the low resistance oxide layer. Consequently, it is possible to achieve improvement of electric characteristics.

According to the first display of the embodiment of the disclosure, the above-described thin film transistor is provided. Therefore, it is possible to achieve improvement of electric characteristics of the thin film transistor.

According to the electronic apparatus of the embodiment of the disclosure, the display including the above-described thin film transistor is provided. Therefore, it is possible to achieve improvement of electronic characteristics of the thin film transistor.

According to the embodiments of the disclosure, in the first protection film, sufficient conduction between the semiconductor layer and the electrode layer of the source-drain electrodes is possible. In addition, the semiconductor layer is protected by the second protection film, and is accordingly insulated sufficiently. Therefore, it is possible to achieve a thin film transistor having a configuration that prevents the semiconductor layer from being damaged in manufacturing, has high reliability, and is manufactured with a high yield. In addition, since the process of processing the protection film is unnecessary, the number of manufacturing processes is allowed to be reduced compared with the configuration of a thin film transistor in a related art.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, preferred embodiments of the disclosure will be described in detail with reference to drawings. Note that the description will be given in the following order.

1. First Embodiment (an example of a thin film transistor in which a part of a low resistance oxide film is increased in resistance to form an oxide semiconductor layer as a channel, after formation of source-drain electrodes)
2. Modification 1 (an example in a case where resistance-increasing treatment is performed at the time of formation of a protection film)
3. Second Embodiment (an example of a thin film transistor in which a part of an oxide film is crystallized to form an oxide semiconductor layer)
4. Third Embodiment (a thin film transistor)
5. Fourth Embodiment (a display)
6. Modifications
7. Application Examples (examples of an electronic apparatus)

First Embodiment

Configuration

Figure 1:
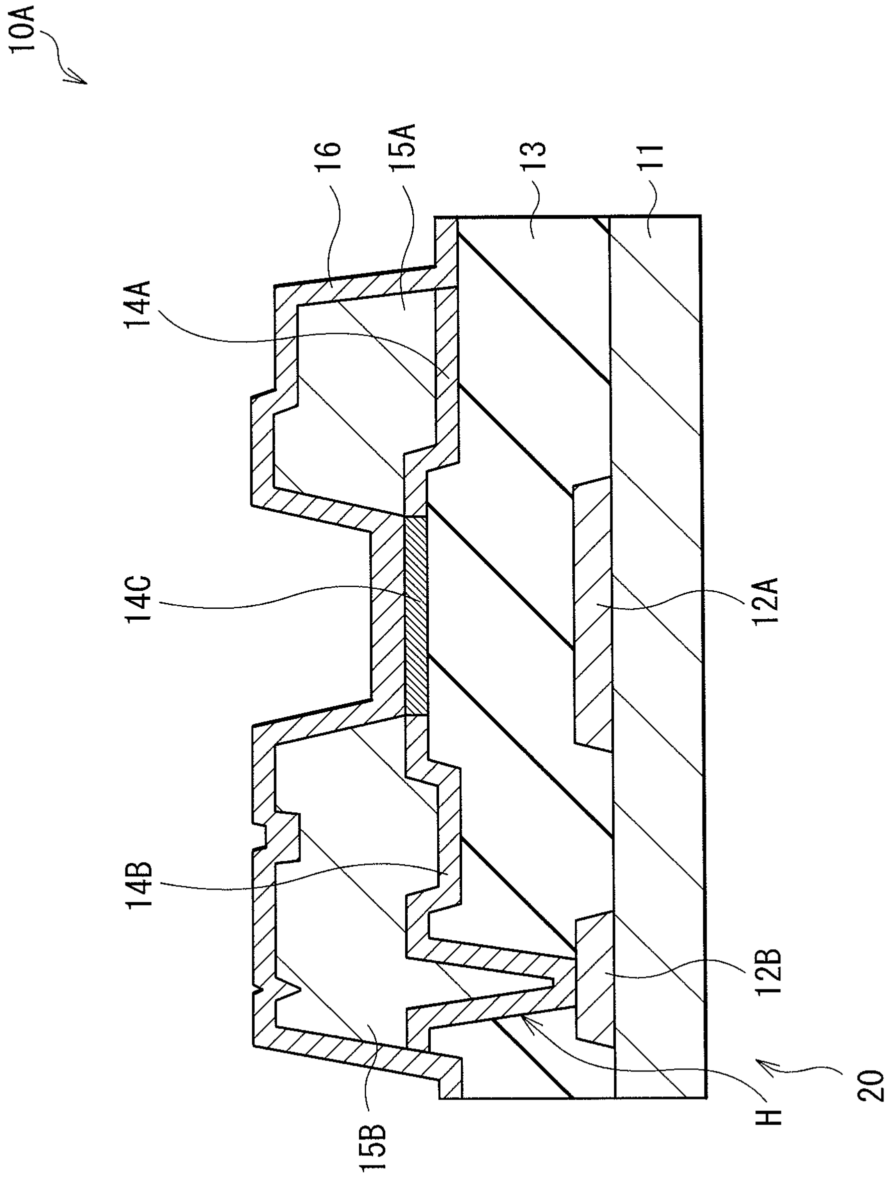
FIG. 1 is a sectional diagram of a thin film transistor according to a first embodiment of the disclosure.

FIG. 1 illustrates a cross-sectional structure of a thin film transistor (a thin film transistor 10A) according to a first embodiment of the disclosure. The thin film transistor 10A may be used as a drive device in, for example, an active matrix organic EL display (described later) and a liquid crystal display. In the thin film transistor 10A, on one surface side of a gate electrode 12A, an oxide semiconductor layer 14C is provided with a gate insulating film 13 in between, and a pair of source-drain electrodes 15A and 15B is provided so as to be electrically connected to the oxide semiconductor layer 14C.

Here, the thin film transistor 10A has a so-called bottom-gate structure (inverted staggered structure), and has the gate electrode 12A in a selective region on a substrate 11 formed of, for example, glass. The gate insulating film 13 is so formed on the entire surface of the substrate 11 as to cover the gate electrode 12. The oxide semiconductor layer 14C is formed in a selective region (a region opposing to the gate electrode 12A) on the gate insulating film 13. The source-drain electrodes 15A and 15B are disposed on a layer higher than the oxide semiconductor layer 14C. A protection film 16 is so provided as to cover the oxide semiconductor layer 14C and the source-drain electrodes 15A and 15B.

In the thin film transistor 10A of the first embodiment, the oxide semiconductor layer 14C is formed in a region not facing the source-drain electrodes 15A and 15B (in a region exposed from the source-drain electrodes 15A and 15B). Low resistance oxide layers 14A and 14B are provided in regions adjacent to the oxide semiconductor layer 14C and facing each of the source-drain electrodes 15A and 15B. In other words, in the first embodiment, the oxide semiconductor layer 14C and each of the source-drain electrodes 15A and 15B are electrically connected to each other through the low resistance oxide layers 14A and 14B, respectively.

In addition, a contact portion (a wiring contact portion 20) is provided in an arbitrary region on the substrate 11 in the thin film transistor 10A. The wiring contact portion 20 allows interlayer connection between an electrode or a wiring (a gate layer) provided in the same layer as the gate electrode 12A and an electrode or a wiring (a source-drain layer) provided in the same layer as the source-drain electrodes 15A and 15B. In the wiring contact portion 20, the gate insulating film 13 has a contact hole H on a wiring layer 12B that is provided on the same layer as the gate electrode 12A. The low resistance oxide layer 14B is formed to cover an inside of the contact hole H, and the source-drain electrode 15B is further provided on the contact hole H with the low resistance oxide layer 14B in between. Each of the components will be described below.

The gate electrode 12A controls carrier density in the oxide semiconductor layer 14C with use of a gate voltage (Vg) applied to the thin film transistor 10A. The gate electrode 12A is a single substance or an alloy of one of molybdenum (Mo), aluminum, silver (Ag), and copper (Cu), for example, or a multilayered film formed of two or more thereof. Examples of the aluminum alloy include an alloy (AlNd alloy) of aluminum and neodymium (Nd). The gate electrode 12A may be configured of a transparent conductive film such as indium tin oxide (ITO), aluminum-doped zinc oxide (AZO), and gallium-doped zinc oxide (GZO).

The wiring layer 12B is provided on the same layer as the gate electrode 12A, for example, and is formed of the same material as that of the gate electrode 12A. The wiring layer 12B and the gate electrode 12A are collectively formed by patterning in the same process. The wiring layer 12B corresponds to any of wirings provided in, for example, a drive circuit in the display described later. Herein, as will be described later, in the drive circuit, a plurality of transistors, capacitors, and wirings connecting the transistors and the capacitor are provided. The electrodes and wirings of these components are all provided in the gate layer or the source-drain layer. In other words, in each of the gate layer and the source-drain layer, to achieve complicated layout of the wirings, it is necessary to draw other various wirings in addition to the electrodes functioning as the gate, the source, and the drain of the transistor, or to establish interlayer connection between the wirings. For example, a wiring is ideally drawn in the source-drain layer in which a metal with higher thickness (i.e., with low resistance) is usable. However, many signal lines are arranged in the source-drain layer. Therefore, shifting the region formed with the wirings from the source-drain layer to the gate layer allows various wirings to be provided in an intersected manner, thereby achieving complicated layout of the wirings. The wiring layer 12B and the wiring contact portion 20 correspond to a contact portion (a bridge) between the source-drain layer and the gate layer.

The gate insulating film 13 is a single-layer film formed of one of silicon oxide ($SiO_X$), silicon nitride (SiN), silicon oxynitride (SiON), and the like, or is a multilayer film formed of two or more thereof.

The oxide semiconductor layer 14C functions as an active layer (a channel) (forms a channel in response to application of the gate voltage), and is formed of an oxide of one of, for example, indium (In), gallium (Ga), tin (Sn), and zinc (Zn), or an oxide of a mixture of two or more thereof. Examples of the oxide include indium gallium zinc oxide (IGZO, InGaZnO). The thickness of the oxide semiconductor layer 14C is, for example, from 20 nm to 100 nm both inclusive. As will be described later, the oxide semiconductor layer 14C is formed through an increase in resistance of a part of an oxide film (a low resistance oxide film 14) configuring the low resistance oxide layers 14A and 14B (the oxide semiconductor layer 14C corresponds to a portion increased in resistance).

Each of the low resistance oxide layers 14A and 14B is formed of the same oxide as that of the oxide semiconductor layer 14C, and has a thickness equal to that of the oxide semiconductor layer 14C. Although the detail will be described later, the low resistance oxide layers 14A and 14B correspond to a remaining region that is not increased in resistance, after a part of the oxide film described later (the low resistance oxide film 14) is increased in resistance (after formation of the oxide semiconductor layer 14C). Therefore, each of the low resistance oxide layers 14A and 14B has electric resistivity lower than that of the oxide semiconductor layer 14C, and specifically, has the electric resistivity of from about 20 μΩ·m to about 40 μΩ·m both inclusive. The source-drain electrodes 15A and 15B are stacked on such low resistance oxide layers 14A and 14B, and planar shapes of the source-drain electrodes 15A and 15B along the substrate surface are substantially the same as each other. Accordingly, the low resistance oxide layers 14A and 14B function as electric contact layers between the oxide semiconductor layer 14C and the source-drain electrodes 15A and 15B.

The above-described oxide configuring the oxide semiconductor layer 14C and the low resistance oxide layers 14A and 14B is resistant to a chemical solution used in patterning the source-drain electrodes 15A and 15B. For example, when PAN-based (phosphoric acid-acetic acid-nitric acid-based), hydrofluoric acid-based, or hydrochloric acid-based chemical solution is used, the above-described oxide may have etching resistance to the chemical agent used. Alternatively, when materials of the oxide semiconductor layer 14C and the source-drain electrodes 15A and 15B are used in combination not having wet etching selectivity, gas for dry etching is appropriately selected to allow selective processing. In addition, in the first embodiment, such an oxide does not have crystallinity (property capable of being crystallized), and the oxide semiconductor layer 14C and the low resistance oxide layers 14A and 14B are all amorphous.

The source-drain electrodes 15A and 15B function as the source electrode or the drain electrode. In this embodiment, one of the source-drain electrodes 15A and 15B is the source electrode and the other is the drain electrode. The material of the source-drain electrodes 15A and 15B is a metal or a transparent conductive film that are equivalent to those described for the above-described gate electrode 12A. For example, the source-drain electrodes 15A and 15B may be formed of a three-layer film configured by stacking titanium (Ti) with a thickness of 50 nm, aluminum (Al) with a thickness of from 200 nm to 1 μm both inclusive, and molybdenum with a thickness of 50 nm.

The protection film 16 is formed of, for example, aluminum oxide ($AlO_X$) or silicon oxide ($SiO_X$). The protection film 16 protects the inside of the thin film transistor 10A, and prevents ambient air (for example, hydrogen) from entering the oxide semiconductor layer 14C.

[Manufacturing Method]

FIG. 2A to FIG. 6 are sectional diagrams for explaining a method of manufacturing the thin film transistor 10A. The thin film transistor 10A is allowed to be manufactured in the following way, for example.

Figure 2A:
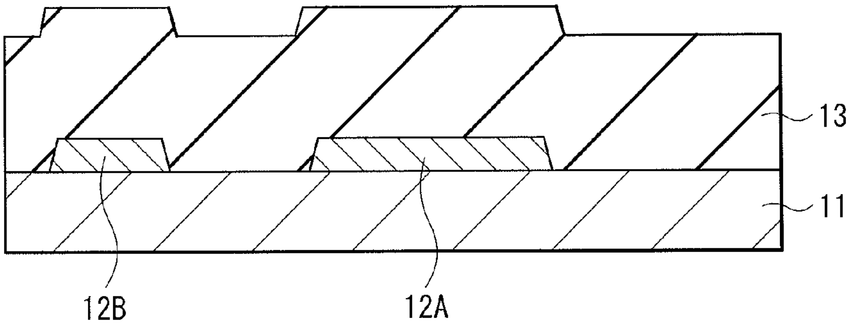
FIGS. 2A and 2B are sectional diagrams for explaining a method of manufacturing the thin film transistor illustrated in FIG. 1.

First, as illustrated in FIG. 2A, the gate electrode 12A and the wiring layer 12B are formed, and the gate insulating film 13 is then formed. Specifically, first, a metal film formed of the above-described material is deposited on the entire surface of the substrate 11 by, for example, sputtering or chemical vapor deposition (CVD), and then, the deposited metal film is patterned by etching using photolithography, for example. As a result, the gate electrode 12A and the wiring layer 12B are formed in selective regions on the substrate 11. Subsequently, the gate insulating film 13 is formed on the entire surface of the substrate 11 by, for example, CVD. At this time, when a silicon nitride film is formed as the gate insulating film 13, a mixed gas containing, for example, silane ($SiH_4$), ammonia ($NH_3$), and nitrogen is used as a material gas. Alternatively, when a silicon oxide film is formed as the gate insulating film 13, a mixed gas containing, for example, silane and dinitrogen monoxide ($N_2O$) is used.

Figure 2B:
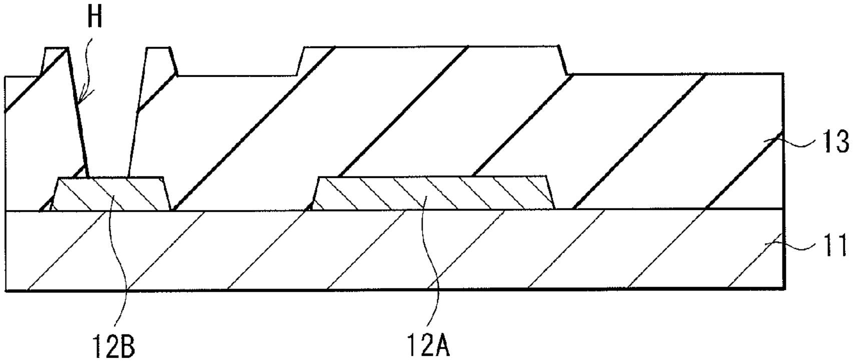

Next, as illustrated in FIG. 2B, the contact hole H is formed in a region (a region facing the wiring layer 12B) on the wiring layer 12B, of the formed gate insulating film 13 by etching using photolithography, for example. Note that the contact hole H is desirably processed to provide favorable electrical connection between the wiring layer 12B provided on the gate layer and the wirings provided on the source-drain layer (here, the source-drain electrodes 15A and 15B).

Figure 3A:
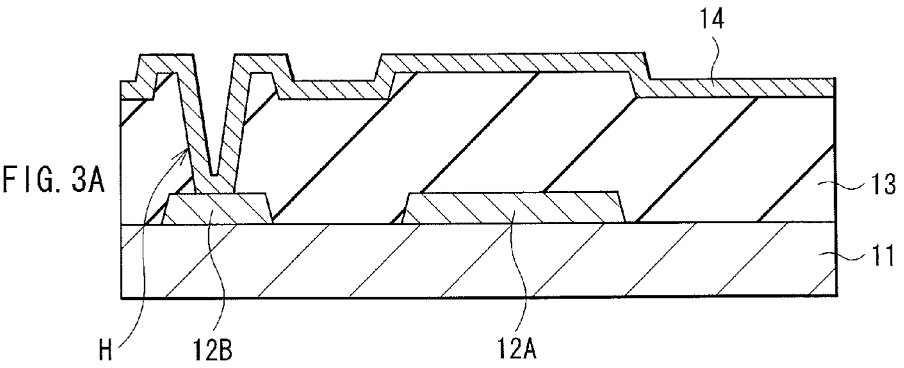
FIGS. 3A and 3B are sectional diagrams illustrating processes following the process of FIG. 2B.

Then, as illustrated in FIG. 3A, the oxide film 14 (a film that is eventually to be the oxide semiconductor layer 14C and the low resistance oxide layers 14A and 14B in the subsequent processes) is formed over the entire surface of the substrate 11 by, for example, sputtering. At this time, the oxide film 14 is formed to cover the inside of the contact hole H as well. Note that film formation using sputtering enables film formation on a large substrate and reduction in temperature in processes. Thus, existing equipment used in production line of silicon-based thin film transistor is advantageously employed.

Specifically, when IGZO is used as the oxide, reactive sputtering (DC sputtering, RF sputtering, or AC sputtering) is performed with ceramic of IGZO as a target. For example, in a sputtering apparatus, after the air is evacuated from a chamber until predetermined degree of vacuum (for example, equal to or less than $1\times10^{-4}$ Pa), the target and the substrate 11 are disposed, and a mixed gas of, for example, argon (Ar) and oxygen ($O_2$) is introduced to perform plasma discharge. As a result, the oxide film 14 formed of IGZO is deposited on the gate insulating film 13.

Incidentally, at this time, conditions of the above-described sputtering is adjusted so that the oxide film 14 to be formed exhibits lower electric resistivity. In detail, one or more of sputtering output (power), oxygen concentration, watery vapor concentration, and sputtering back pressure are adjusted to change composition ratio and crystallinity of metal elements in the film formation material, thereby controlling electric resistivity (carrier density). In particular, when the oxygen concentration of the above-described conditions is set to be low, low resistance is achievable with ease. Since a part of the oxide film 14 eventually becomes the low resistance oxide layers 14A and 14B, the electric resistivity of the oxide film 14 immediately after formation becomes the electric resistivity of the above-described low resistance oxide layers 14A and 14B (the oxide film 14 has the electric resistivity equivalent to that of the low resistance oxide layers 14A and 14B).

Figure 3B:
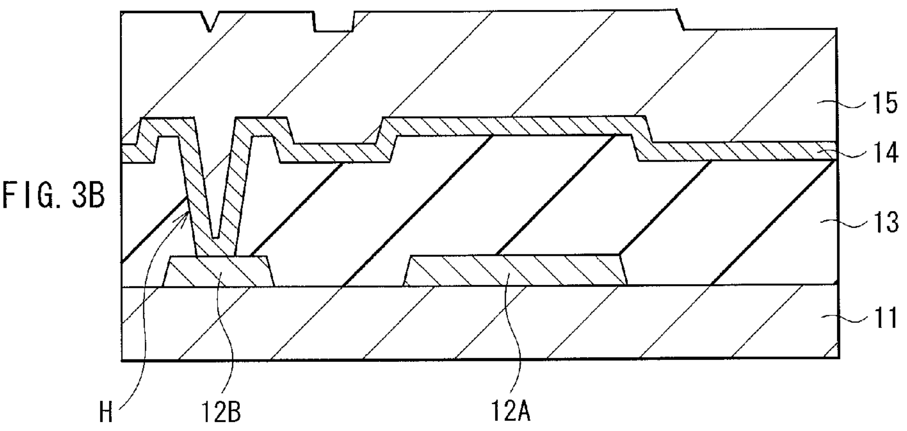

Next, as illustrated in FIG. 3B, a metal layer 15 (the source-drain electrodes 15A and 15B) is formed. Specifically, the above-described electrode materials (for example, titanium, aluminum, and molybdenum) are deposited in order on the oxide film 14 by, for example, sputtering to form the metal layer 15 (the source-drain electrodes 15A and 15B).

The formation process of the metal layer 15 is performed following the above-described formation process of the oxide film 14. In other words, the metal layer 15 to be the source-drain electrodes 15A and 15B is formed before patterning of the oxide film 14.

Figure 4:
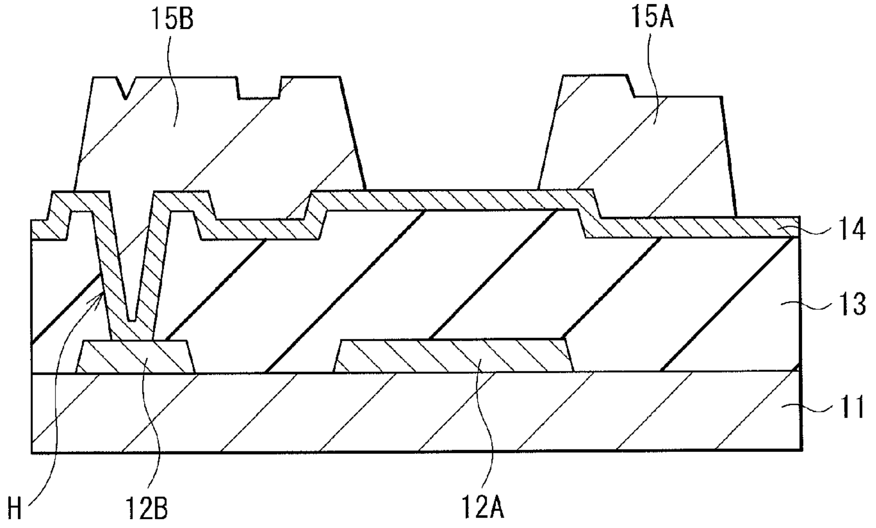
FIG. 4 is a sectional diagram illustrating a process following the process of FIG. 3B.

Subsequently, as illustrated in FIG. 4, the metal layer 15 is patterned by wet etching or dry etching with use of photolithography, for example, to form the source-drain electrodes 15A and 15B. At this time, the etching is performed under the condition where an etching selection ratio is determined with respect to the oxide film 14 on the lower layer. For example, the etching is performed with use of, for example, a PAN-based, a hydrofluoric acid-based, or a hydrochloric acid-based chemical solution to which the oxide film 14 is resistant. In this way, the source-drain electrodes 15A and 15B are selectively patterned on the oxide film 14. Note that, at this time, a part of the source-drain electrode 15B is remained in a region on the contact hole H so as to allow the source-drain electrode 15B to be electrically connected to the wiring layer 12B through the oxide film 14 (the low resistance oxide layer 14B).

Figure 5:
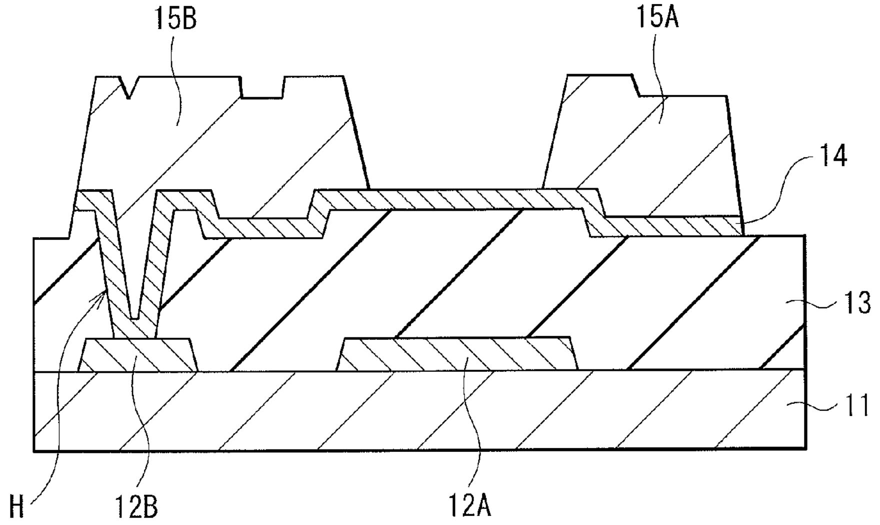
FIG. 5 is a sectional diagram illustrating a process following the process of FIG. 4.

Next, as illustrated in FIG. 5, the oxide film 14 is patterned, for example, in an island shape by etching with use of photolithography, for example. The patterning enables the oxide film 14 to be remained only in the source-drain electrodes 15A and 15B and a region between the source-drain electrodes 15A and 15B, thereby preventing conduction with other regions. However, when not causing particular inconvenience in the state of being subjected to subsequent resistance-increasing treatment, the oxide film 14 is not necessarily patterned, and may be formed on the entire surface of the substrate 11. Alternatively, the oxide film 14 may be patterned together with the protection film 16 in a subsequent formation process of the protection film 16.

Figure 6:
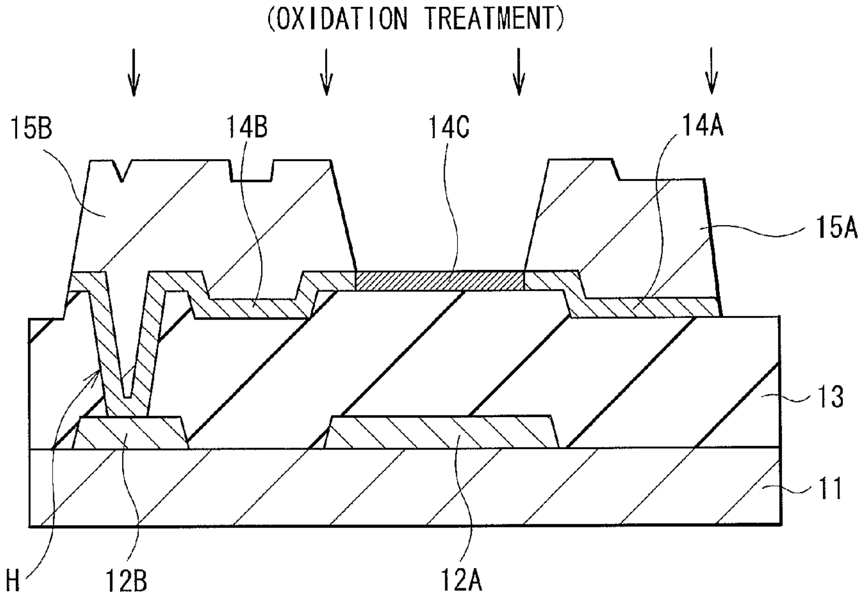
FIG. 6 is a sectional diagram illustrating a process following the process of FIG. 5.

After that, as illustrated in FIG. 6, the selective region of the oxide film 14, specifically, the region that is located between the source-drain electrodes 15A and 15B and is exposed from the source-drain electrodes 15A and 15B is subjected to resistance-increasing treatment. For example, under oxidation atmosphere, heat treatment or plasma treatment is performed to increase resistance. At this time, the formed source-drain electrodes 15A and 15B are used as a mask, and the above-described selective region is oxidized and accordingly increased in resistance. As a result, the portion increased in resistance becomes the oxide semiconductor layer 14C. On the other hand, in regions facing the source-drain electrodes 15A and 15B of the oxide film 14, the resistance is not increased and the electric resistivity of the oxide film 14 is maintained because the regions are not exposed to the oxidation atmosphere. In addition, the resistance in a portion extended and formed in the contact hole H is maintained low because the portion is also masked by the source-drain electrodes 15A and 15B. The portions not increased in resistance (the portions maintained low in resistance) become the low resistance oxide layers 14A and 14B. In this way, the selective region of the oxide film 14 is increased in resistance after the formation of the source-drain electrodes 15A and 15B so that the oxide semiconductor layer 14C is formed. In addition, at the same time, the low resistance oxide layers 14A and 14B that are to be contact layers between the oxide semiconductor layer 14C and the source-drain electrodes 15A and 15B are allowed to be formed.

Finally, the protection film 16 is formed. Specifically, an oxide film formed of the above-described materials is formed over the entire surface of the substrate 11 by, for example, sputtering or CVD. For example, when aluminum oxide is used, the oxide film is formed by sputtering with use of aluminum or aluminum oxide as a target and performing plasma discharge with use of mixed gas of argon and oxygen. Alternatively, when silicon oxide is used, the oxide film is formed by CVD under gas atmosphere containing, for example, silane and dinitrogen monoxide. After that, the protection film 16 is patterned in a desired shape by etching with use of photolithography, for example. As described above, the thin film transistor 10A illustrated in FIG. 1 is completed.

[Function and Effects]

In the first embodiment, in a process of manufacturing the thin film transistor 10A, the oxide semiconductor layer 14C is formed in the region not facing the source-drain electrodes 15A and 15B, whereas the low resistance oxide layer 14A is formed in the region facing the source-drain electrode 15A, and the low resistance oxide layer 14B is formed in the regions facing the source-drain electrode 15B, the regions being adjacent to the oxide semiconductor layer 14C. Therefore, the oxide semiconductor layer 14C is allowed to be formed after the formation of the source-drain electrodes 15A and 15B. In this case, in the oxide semiconductor, generally, oxygen desorption occurs due to damage at the time of formation or patterning of the electrode, thereby causing lattice defect. However, as in the first embodiment, the formation of the oxide semiconductor layer 14C after the formation of the electrode suppresses occurrence of such lattice defect and accordingly prevents deterioration of the oxide semiconductor layer. Moreover, the low resistance oxide layers 14A and 14B formed adjacent to the oxide semiconductor layer 14C ensures favorable electrical connection between the oxide semiconductor layer 14C and the source-drain electrodes 15A and 15B.

Figure 7:
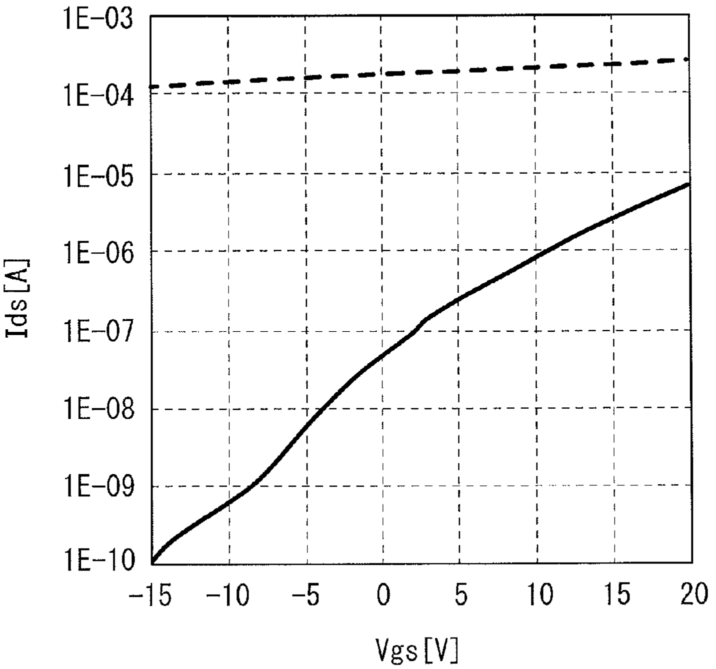
FIG. 7 is a diagram illustrating electric characteristics before and after resistance-increasing treatment.

FIG. 7 illustrates an example of electric characteristics of the thin film transistor 10A. A solid line in FIG. 7 indicates IV characteristics (a relationship between a drain current Ids and a gate voltage Vgs) of a thin film transistor which was subjected to resistance-increasing treatment (having the oxide semiconductor layer 14C), and a dashed line indicates IV characteristics of a thin film transistor which was fabricated without resistance-increasing treatment (the oxide semiconductor film 14 was used as it is for a channel). In addition, as for the oxide semiconductor layer 14C, a film of IGZO was formed to have a thickness of 40 nm with oxygen partial pressure of 0% at the time of sputtering, and the film of IGZO was patterned and then was subjected to heat treatment (300° C., 2 hours) under oxygen atmosphere. It can be seen from FIG. 7 that performing the resistance-increasing treatment particularly suppresses the drain current at the time of off operation, and that transistor operation is exhibited.

Moreover, in the first embodiment, the oxide film 14 that is to be the oxide semiconductor layer 14C and the low resistance oxide layers 14A and 14B, and the metal layer 15 that is to be the source-drain electrodes 15A and 15B, are successively formed, and then the metal layer 15 is patterned to form the source-drain electrodes 15A and 15B. After that, the resistance-increasing treatment is performed with use of the source-drain electrodes 15A and 15B as a mask so that the oxide semiconductor layer 14C and the low resistance oxide layers 14A and 14B described above are formed.

Figure 8:
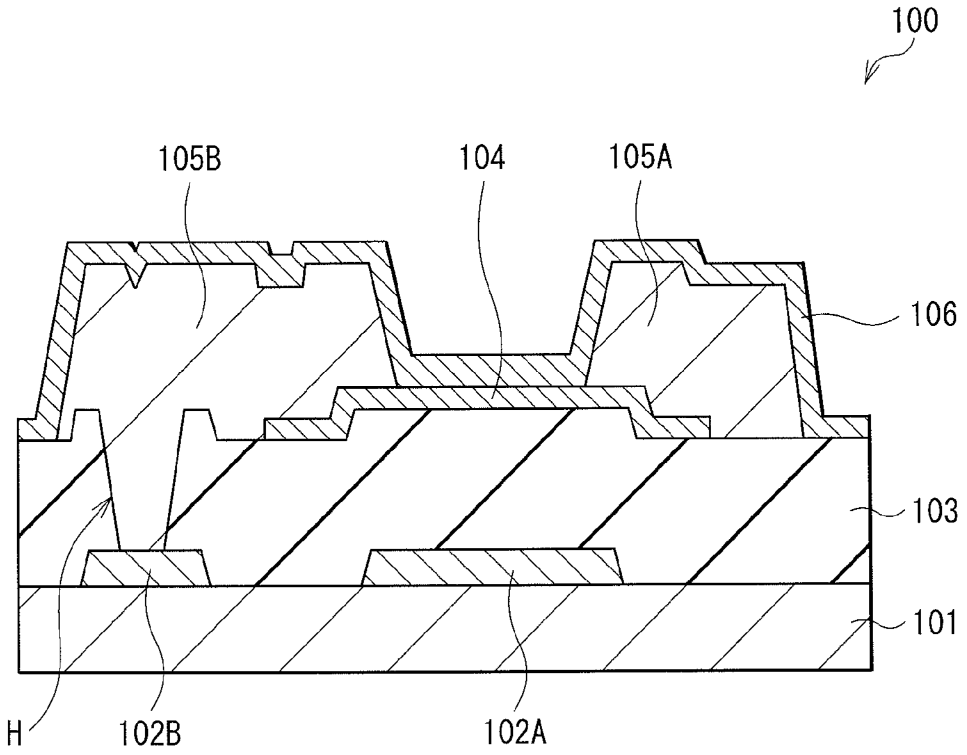
FIG. 8 is a sectional diagram of a thin film transistor according to a comparative example.
Figure 9A:
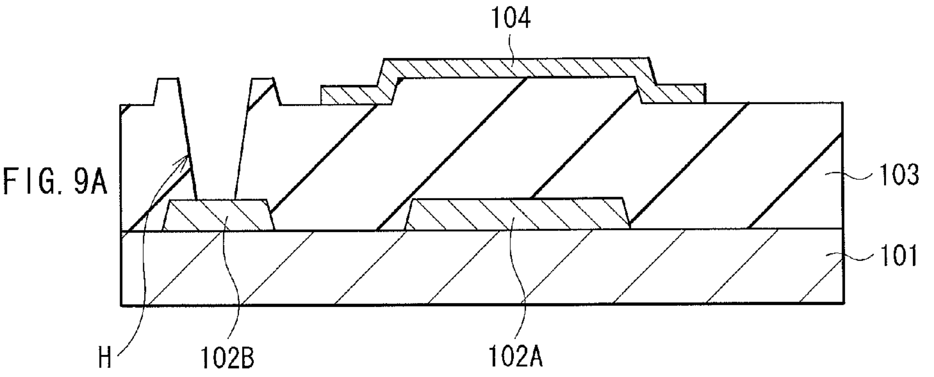
FIGS. 9A and 9B are sectional diagrams for explaining a method of manufacturing the thin film transistor illustrated in FIG. 8.
Figure 9B:
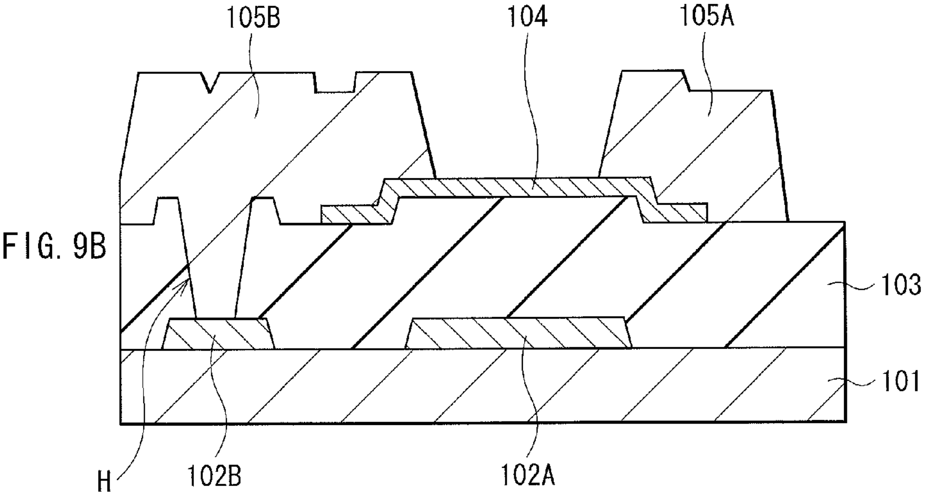

A thin film transistor (a thin film transistor 100) according to a comparative example of the first embodiment is now described. FIG. 8 illustrates a cross-sectional structure of the thin film transistor 100, and FIGS. 9A and 9B are diagrams for explaining a method of manufacturing the thin film transistor 100. Also in the thin film transistor 100, as in the first embodiment, a gate insulating film 103 is so formed on a substrate 101 as to cover a gate electrode 102A and a wiring layer 102B, and the contact hole H is provided on the gate insulating film 103 to face the wiring layer 102. In the comparative example, however, an oxide semiconductor layer 104 is formed by patterning only in a selective region (in a region opposing the gate electrode 102A) on the gate insulating layer 103. Source-drain electrodes 105A and 105B are provided to be overlapped with a part of the oxide semiconductor layer 104. Only the source-drain electrode 105B is embedded in the contact hole H, and thus electrical connection between the wiring layer 102B and the source-drain electrode 105B is ensured.

In the process of manufacturing such a thin film transistor 100 of the comparative example, the oxide semiconductor layer 104 is formed after the formation of the gate insulating film 103, as illustrated in FIG. 9A. At this time, first, an oxide semiconductor film is formed over the entire surface of the substrate 101, and then patterning is performed by etching with use of photolithography. After that, as illustrated in FIG. 9B, the source-drain electrodes 105A and 105B are formed through film formation process and patterning process in order. Accordingly, in the manufacturing process such as that in the comparative example, the formation process of the oxide semiconductor layer 104 by sputtering is necessary independently from the formation process of the source-drain electrodes 105A and 105B by sputtering. Thus, the cost is likely to be increased.

As described above, in the first embodiment, the oxide film 14 is previously formed in the state where the resistance is low. After the formation of the source-drain electrodes 15A and 15B, oxidation treatment (resistance-increasing treatment) is performed with use of the source-drain electrodes 15A and 15B as a mask. Therefore, only a necessary portion of the oxide film 14 is selectively increased in resistance to form the oxide semiconductor layer 14C functioning as a channel. In addition, in the oxide film 14, the resistance in the regions adjacent to the oxide semiconductor layer 14C and facing the respective source-drain electrodes 15A and 15B are maintained low and the regions becomes favorable contact layers. Compared with a typical manufacturing process, film formation process by sputtering is reduced, and cost reduction is achievable.

Moreover, in the above-described comparative example, if the oxide semiconductor layer 104 covers the inside of the contact hole H, it is difficult to ensure electrical connection between the wiring layer 102B and the source-drain electrode 105B. Therefore, a film of a semiconductor material formed inside the contact hole H is necessary to be removed in patterning. In contrast, in the first embodiment, since the oxide film 14 is formed in advance in a low resistance state, it is not necessary to remove the film from the inside of the contact hole H, and patterning is also unnecessary.

As described above, in the first embodiment, the oxide semiconductor layer 14C is provided in the region not facing the source-drain electrodes 15A and 15B, whereas the low resistance oxide layer 14A is formed in the region facing the source-drain electrode 15A and the low resistance oxide layer 14B is formed in the region facing the source-drain electrode 15B, the regions being adjacent to the oxide semiconductor layer 14C. Accordingly, deterioration of the oxide semiconductor layer 14C in the manufacturing process is prevented. In addition, the low resistance oxide layers 14A and 14B ensure favorable electrical connection between the oxide semiconductor layer 14C and the source-drain electrodes 15A and 15B. Therefore, improvement in electric characteristics is achievable.

Hereinafter, a modification of the above-described first embodiment and other embodiments will be described. Note that like numerals are used to designate substantially like components of the above-described first embodiment, and the description thereof is appropriately omitted.

[Modification 1]

Figure 10:
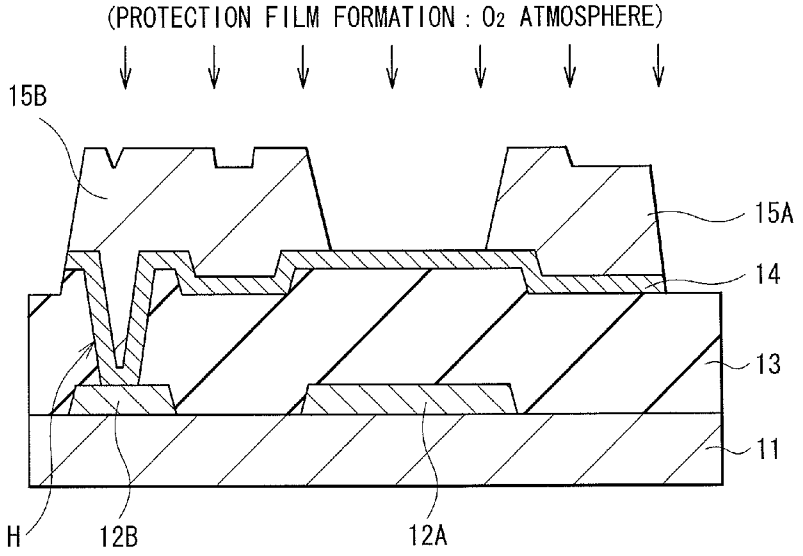
FIG. 10 is a sectional diagram for explaining a method of manufacturing a thin film transistor according to a modification.
Figure 11:
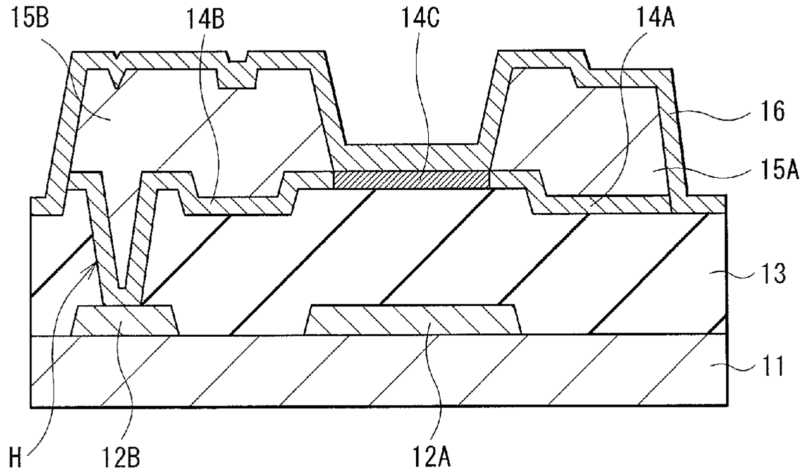
FIG. 11 is a sectional diagram illustrating a process following the process of FIG. 10.

In the above-described first embodiment, in the manufacturing process, the oxide film 14 is increased in resistance by the heat treatment or the plasma treatment under the oxidation atmosphere before the formation of the protection film 16. Alternatively, as in a modification 1, the resistance-increasing treatment may be performed during the formation process of the protection film 16. Specifically, as described above, the protection film 16 is formed by, for example, sputtering with use of oxygen gas or CVD with use of gas containing dinitrogen monoxide. Therefore, as illustrated in FIG. 10, the oxide film 14 is exposed to the film formation atmosphere (the oxygen atmosphere) of the protection film 16 so that the oxide film 14 is selectively oxidized. In other words, the formation process of the protection film 16 doubles as the oxidation process (the resistance-increasing process) of the above-described first embodiment. Accordingly, as illustrated in FIG. 11, the oxide semiconductor layer 14C and the low resistance oxide layers 14A and 14B are allowed to be formed at the same time as the formation of the protection film 16.

Second Embodiment

Figure 12:
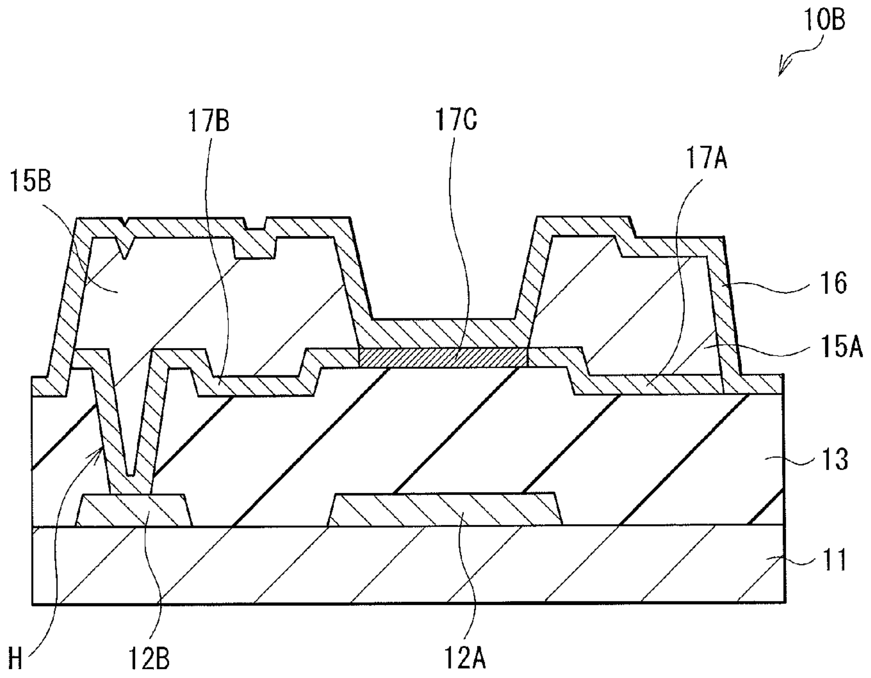
FIG. 12 is a sectional diagram illustrating a thin film transistor according to a second embodiment of the disclosure.

FIG. 12 illustrates a cross-sectional structure of a thin film transistor (a thin film transistor 10B) according to a second embodiment of the disclosure. The thin film transistor 10B has a bottom gate structure as with the thin film transistor 10A of the above-described first embodiment, and an oxide semiconductor layer 17C is formed in a region not facing the source-drain electrodes 15A and 15B on the gate insulating film 13. In addition, in regions adjacent to the oxide semiconductor layer 17C and facing the respective source-drain electrodes 15A and 15B, low resistance oxide layers 17A and 17B are formed.

Each of the oxide semiconductor layer 17C and the low resistance oxide layers 17A and 17B is formed of an oxide containing elements (such as indium) similar to those in the oxide semiconductor layer 14C of the above-described first embodiment. In addition, each of the low resistance oxide layers 17A and 17B exhibits electric resistivity lower than that of the oxide semiconductor layer 17C, and the low resistance oxide layer 17B is formed to cover the inside of the contact hole H.

In the second embodiment, however, as an oxide configuring the oxide semiconductor layer 17C and the low resistance oxide layers 17A and 17B, an oxide having crystallinity (property capable of being crystallized) is used. In the manufacturing process, after being formed in an amorphous state, the oxide is crystallized in a selective region after the formation of the source-drain electrodes 15A and 15B. Accordingly, the oxide semiconductor layer 17C is in a crystallized state, and the low resistance oxide layers 17A and 17B are in an amorphous state. Hereinafter, the manufacturing process of the second embodiment will be described.

Figure 13:
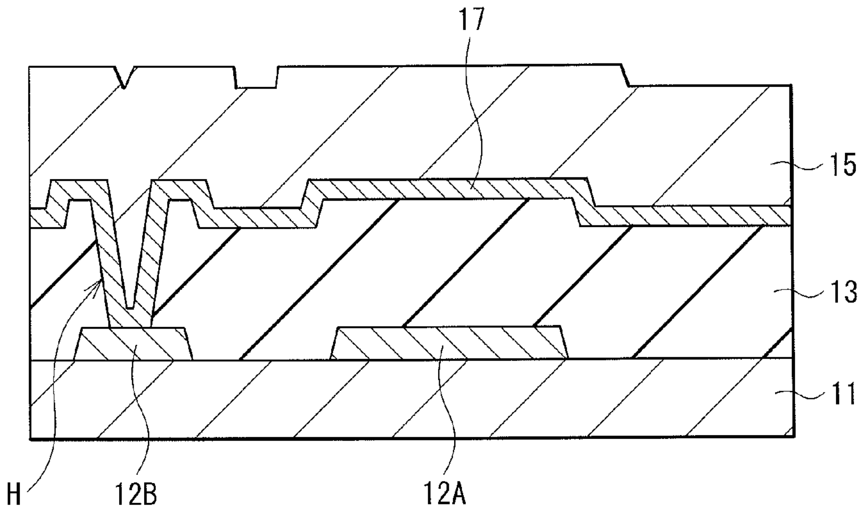
FIG. 13 is a sectional diagram for explaining a method of manufacturing the thin film transistor illustrated in FIG. 12.

Specifically, first, in a similar way to the above-described first embodiment, the gate electrode 12A and the wiring layer 12B are formed on the substrate 11, following which the gate insulating film 13 having the contact hole H is formed. After that, as illustrated in FIG. 13, the oxide film 17 and the metal layer 15 are successively formed on the gate insulating film 13 by, for example, sputtering as described above. At this time, the sputtering condition is adjusted so that the oxide film 17 exhibits low electric resistivity and is formed in an amorphous state.

Figure 14:
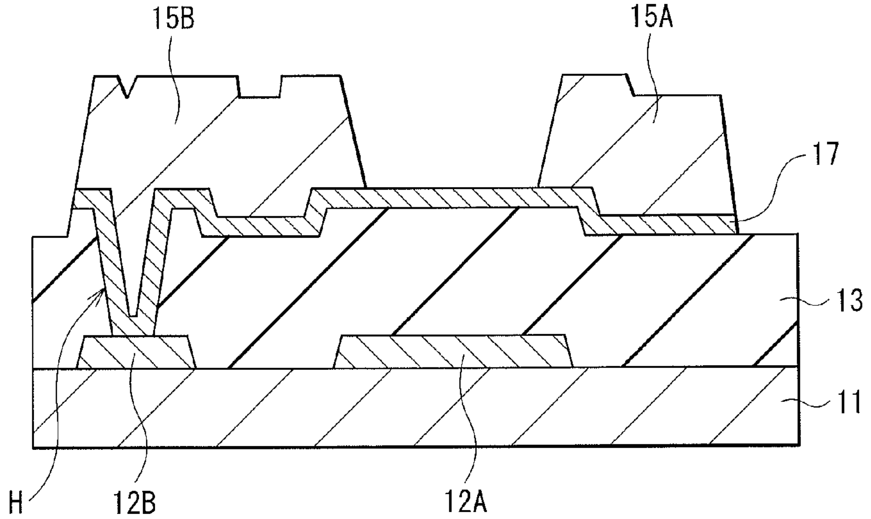
FIG. 14 is a sectional diagram illustrating a process following the process of FIG. 13.

Subsequently, as illustrated in FIG. 14, in a similar way to the above-described first embodiment, the metal layer 15 is patterned to form the source-drain electrodes 15A and 15B, following which the oxide film 17 is patterned.

Figure 15:
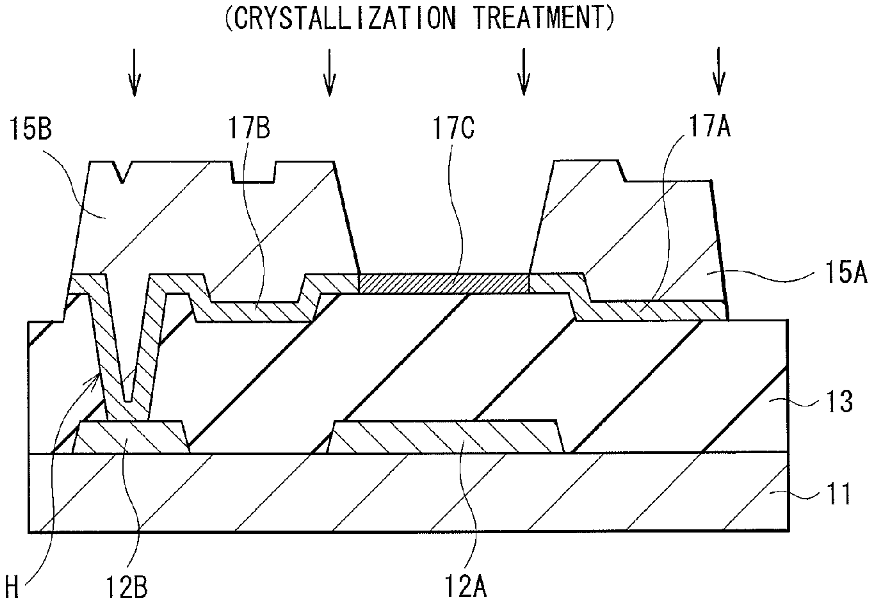
FIG. 15 is a sectional diagram illustrating a process following the process of FIG. 14.

After that, as illustrated in FIG. 15, a selective region of the oxide film 17, specifically, a region that is located between the source-drain electrodes 15A and 15B and is exposed from the source-drain electrodes 15A and 15B is subjected to resistance-increasing treatment. For example, under oxygen atmosphere, heat treatment or plasma treatment is performed to allow the above-described selective region of the oxide film 17, which is in an amorphous state, to be exposed to the oxygen atmosphere and to be crystallized at the same time, and the selective region is accordingly increased in resistance. At this time, as in the above-described first embodiment, the above-described selective region is increased in resistance with use of the formed source-drain electrodes 15A and 15B as a mask, and the region increased in resistance becomes the oxide semiconductor layer 17C. On the other hand, in regions facing the source-drain electrodes 15A and 15B, of the oxide film 17, although a part of the regions is possibly crystallized, resistivity is allowed to be maintained sufficient low even if the part of the regions is crystallized, because the regions are not exposed to the oxygen atmosphere. The regions failed to contribute to increase in resistance become the low resistance oxide layers 17A and 17B. In this way, also in the second embodiment, the oxide semiconductor layer 17C and the low resistance oxide layers 17A and 17B as the contact layers are formed by allowing the selective region of the oxide film 17 to be increased in resistance after the formation of the source-drain electrodes 15A and 15B.

Finally, the protection film 16 is formed in a similar way to the above-described first embodiment, and thus the thin film transistor 10B illustrated in FIG. 12 is completed.

As described above, the oxide film 17 is formed using an oxide having crystallinity and the oxide film 17 is selectively crystallized so as to be increased in resistance. Even in such a case, the low resistance oxide layers 17A and 17B are allowed to maintain electric resistivity substantially equivalent to that of the oxide film 17. Therefore, the effects equivalent to those in the above-described first embodiment are obtainable.

Application Example

Display

Figure 16:
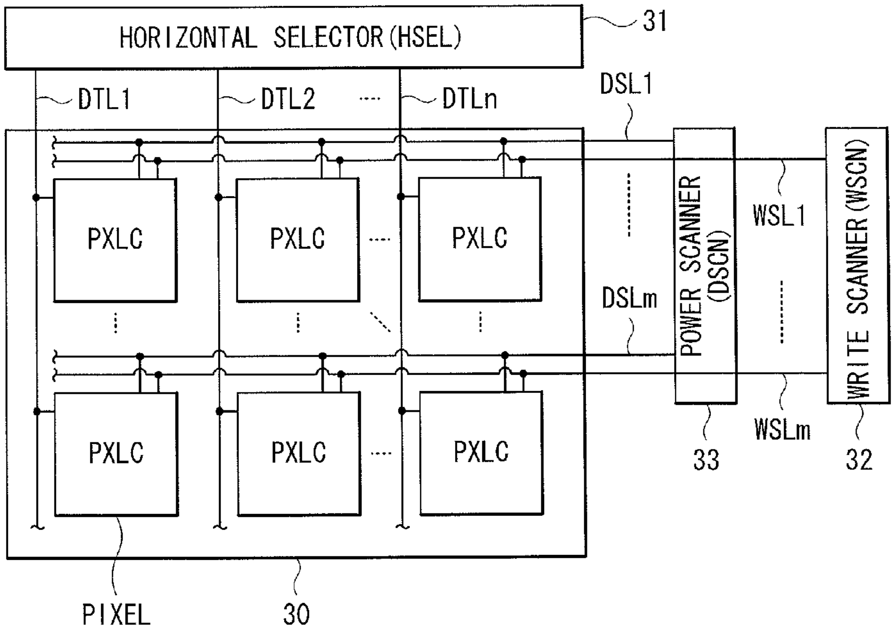
FIG. 16 is a diagram illustrating an entire configuration including peripheral circuits of a display according to any of the embodiments.

The thin film transistors (the thin film transistors 10A and 10B) according to the above-described embodiments and the modification are applicable to, for example, a display and an electronic apparatus described below. FIG. 16 illustrates an entire configuration including peripheral circuits of a display used as an organic EL display. As illustrated in FIG. 16, a display region 30 in which a plurality of pixels PXLC each including an organic EL device are arranged in a matrix is formed on the substrate 11, for example. A horizontal selector (HSEL) 31 as a signal line drive circuit, a write scanner (WSCN) 32 as a scan line drive circuit, and a power scanner (DSCN) 33 as a power line drive circuit are provided in periphery of the display region 30.

In the display region 30, a plurality of (the integer n-number of) signal lines DTL1 to DTLn is arranged in a column direction, and a plurality of (the integer m-number of) scan lines WSL1 to WSLm and a plurality of (the integer m-number of) power lines DSL1 to DSLm are respectively arranged in a row direction. In addition, each of the pixels PXLC (one of the pixels corresponding to R, G, and B) is provided at an intersection of each of the signal lines DTL and each of the scan lines WSL. Each of the signal lines DTL is connected to the horizontal selector 31, and an image signal is supplied from the horizontal selector 31 to each of the signal lines DTL. Each of the scan lines WSL is connected to the write scanner 32, and a scan signal (a selection pulse) is supplied from the write scanner 32 to each of the scan lines WSL. Each of the power lines DSL is connected to the power scanner 33, and a power signal (a control pulse) is supplied from the power scanner 33 to each of the power lines DSL.

Figure 17:
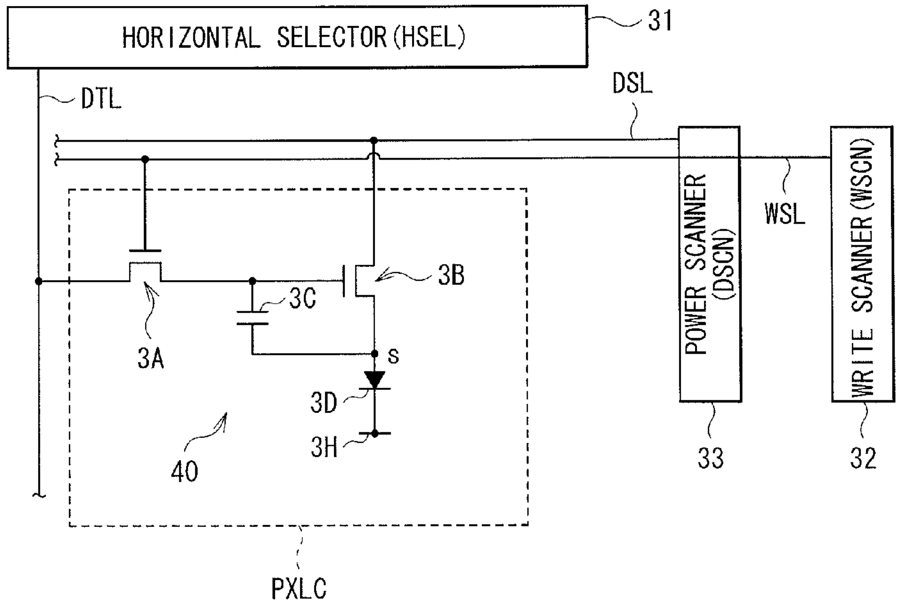
FIG. 17 is a diagram illustrating a configuration of a pixel circuit of the display illustrated in FIG. 16.

FIG. 17 illustrates a specific example of a circuit configuration in the pixel PXLC. Each of the pixels PXLC has a pixel circuit 40 including an organic EL device 3D. The pixel circuit 40 is an active drive circuit including a sampling transistor 3A, a drive transistor 3B, a retention capacitor 3C, and the organic EL device 3D. Of these components, the transistor 3A (or the transistor 3B) corresponds to one of the thin film transistors 10A and 10B of the above-described embodiments and the modification.

A gate of the sampling transistor 3A is connected to a corresponding scan line WSL. One of a source and a drain of the sampling transistor 3A is connected to a corresponding signal line DTL, and the other is connected to a gate of the drive transistor 3B. A drain of the drive transistor 3B is connected to a corresponding power line DSL, and a source thereof is connected to an anode of the organic EL device 3D. In addition, a cathode of the organic EL device 3D is connected to a ground wiring 3H. Incidentally, the ground wiring 3H is wired commonly to all of the pixels PXLC. The retention capacitor 3C is disposed between the source and the gate of the drive transistor 3B.

The sampling transistor 3A becomes conductive in response to the scan signal (the selection pulse) supplied from the scan line WSL to sample a signal potential of an image signal supplied from the signal line DTL, thereby retaining the sampled signal potential in the retention capacitor 3C. The drive transistor 3B is supplied with a current from the power line DSL set to a predetermined first potential (not illustrated), and supplies a drive current to the organic EL device 3D in response to the signal potential retained in the retention capacitor 3C. The organic EL device 3D emits light with luminance corresponding to the signal potential of the image signal, by the drive current supplied from the drive transistor 3B.

In such a circuit configuration, the sampling transistor 3A becomes conductive in response to the scan signal (the selection pulse) supplied from the scan line WSL to sample the signal potential of the image signal supplied from the signal DTL, thereby retaining the sampled signal potential in the retention capacitor 3C. Moreover, the current is supplied from the power line DSL set to the above-described first potential to the drive transistor 3B, and the drive current is supplied to the organic EL device 3D (each of the organic EL devices of red, green, and blue) in response to the signal potential retained in the retention capacitor 3C. Then, each of the organic EL devices 3D emits light with luminance corresponding to the signal potential of the image signal by supplied drive current. As a result, image display based on the image signal is performed on the display.

Third Embodiment

Thin Film Transistor

Figure 18:
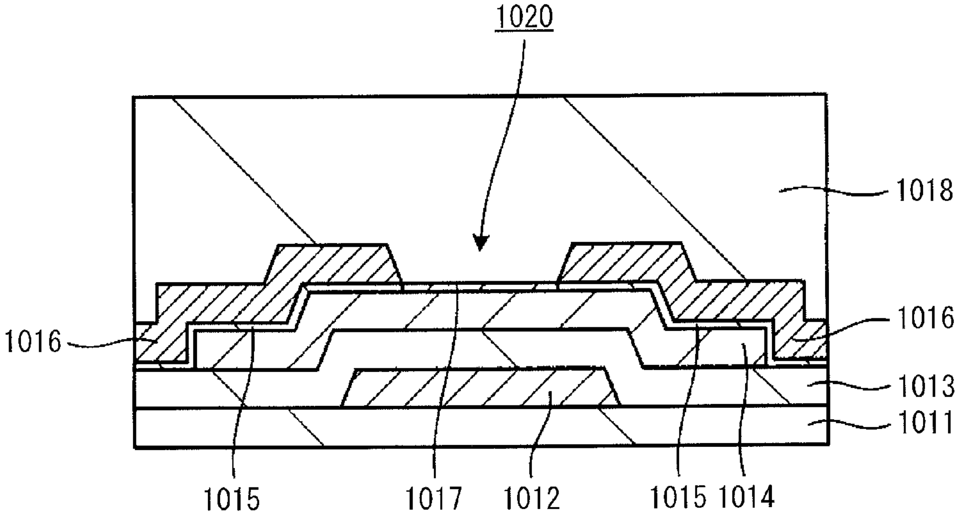
FIG. 18 is a sectional diagram illustrating a schematic structure of a thin film transistor according to a third embodiment of the disclosure.

FIG. 18 illustrates a schematic structure (cross-sectional structure) of a thin film transistor (a thin film transistor 1020) according to a third embodiment. The thin film transistor 1020 illustrated in FIG. 18 includes a gate electrode 1012, an insulating layer 1013, a semiconductor layer 1014 formed with a channel, and electrode layers 1016 that are formed on an insulating substrate 1011 configured of a glass substrate or the like. In addition, an insulating layer 1018 is formed to cover the entire thin film transistor 1020.

The gate electrode 1012 is formed of a metal or an alloy of, for example, Mo and Al, and is formed in a predetermined pattern. The insulating layer 1013 is to be a gate insulating layer of the thin film transistor 1020, and is formed to cover the gate electrode 1012. For example, silicon oxide (SiOx) is used as a material of the insulating layer 1013. The semiconductor layer 1014 is formed of an oxide semiconductor, and is formed in a predetermined pattern on the insulating layer 1013. Examples of the oxide semiconductor of the semiconductor layer 1014 include indium germanium zinc oxide (IGZO), AZTO (AlZnSnO), ZnO, $TiO_2$, $SrTiO_3$, indium tin oxide (ITO), zinc tin oxide (ZTO), indium zinc oxide (IZO), and GZTO (GaZnSnO). The electrode layers 1016 are to be source-drain electrodes of the thin film transistor 1020, and are formed on a right portion and a left portion of the semiconductor layer 1014 in the figure one by one. For example, Ti, Al, and Mo are used as a material of the electrode layer 1016. In addition, the electrode layer 1016 may be formed by stacking a plurality of different electrode materials.

In the thin film transistor 1020 of the third embodiment, a protection film is formed under the electrode layers 1016 and to cover the semiconductor layer 1014. In particular, the protection film is configured of a first protection film 1015 in portions under the electrode layers 1016 and a second protection film 1017 in an opening between the two electrode layers 1016. The first protection film 1015 is formed of a coarse insulating material (such as oxide and nitride) so as to allow contact between the semiconductor layer 104 and the electrode layer 1016. The second protection film 1017 is formed of an insulating material that is similar to that of the first protection film 1015 and degree of oxidation of which is advanced. Thus, the second protection film 1017 is dense compared with the first protection film 1015. The second protection film 1017 is formed in a portion under the opening of the semiconductor layer 1014, namely, in a portion not facing the electrode layer 1016.

As a material of each of the first protection film 1015 and the second protection film 1017, oxides such as SiOx, HfOx, TixOy, MoxOy, AlxOy, SiON, FexOy, MgxOy, ZrxOy, SnxOy, and GexOy, are allowed to be used. The second protection film 1017 has a configuration in which composition ratio y of oxygen is larger than that of the first protection film 1015.

Since the first protection film 1015 is formed of an insulating material such as an oxide, the first protection film 1015 is supposed to be an insulating body. However, since the first protection film 1015 is a film formed of a coarse insulating material, the first protection film 1015 allows a current to be leaked, and sufficient conduction is obtained between the semiconductor layer 1014 and the electrode layers 1016 with the first protection film 1015 in between, by a tunnel current.

An appropriate range of the thickness of the first protection film 1015 depends on a used material. The lower limit of the range is a thickness where stable film formation is allowed and the semiconductor layer 1014 is protected, and the upper limit is a thickness where necessary conduction is obtained between the semiconductor layer 1014 and the electrode layers 1016.

Moreover, in addition to the upper surface, the side surfaces of the semiconductor layer 1014 are also covered with the first protection film 1015. Accordingly, the side surfaces of the semiconductor layer 1014 are prevented from being damaged at the time of formation of the electrode layers 1016.

The thin film transistor 1020 in FIG. 18 is allowed to be manufactured as described below, for example.

Figure 19A:
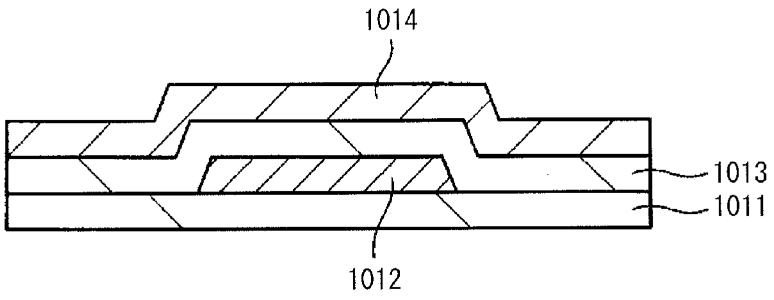
FIGS. 19A to 19C are diagrams illustrating process steps of a method of manufacturing the thin film transistor illustrated in FIG. 18.

First, the gate electrode 1012 is formed in a predetermined pattern on the insulating substrate 1011 configured of a glass substrate or the like. Then, the insulating layer 1013 is formed on the entire surface to cover the gate electrode 1012. Further, as illustrated in FIG. 19A, the semiconductor layer 1014 formed of an oxide semiconductor is formed on the insulating layer 1013. As the oxide semiconductor of the semiconductor layer 1014, the above-described material such as indium germanium zinc oxide (IGZO) is used.

Figure 19B:
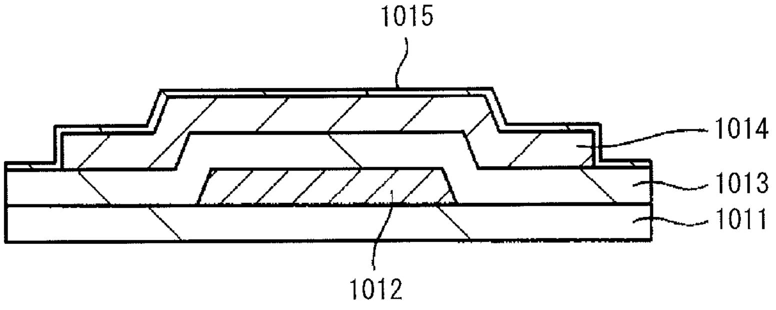

Next, the semiconductor layer 1014 is patterned in the predetermined pattern, following which, as illustrated in FIG. 19B, the coarse first protection film 1015 is formed thin to cover the upper surface and the side surfaces of the semiconductor layer 1014. Examples of a method of forming the first protection film 1015 include atomic layer deposition (ALD), remote plasma source CVD, and thermal CVD using a combination of a material containing silicon and a material containing oxygen such as ozone. With these methods, a base layer, that is, the semiconductor layer 104 in the thin film transistor of FIG. 18 is less damaged. As a material of the first protection film 1015, the above-described materials such as SiOx and $HfO_2$ are allowed to be used. The first protection film 1015 is formed to have a thickness of, for example, from about 1 nm to 50 nm both inclusive.

Figure 19C:
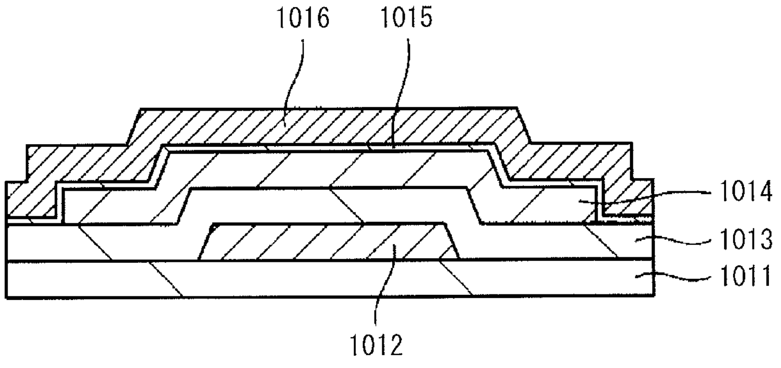

Next, as illustrated in FIG. 19C, the electrode layer 1016 is formed by sputtering or the like to cover the first protection film 1015 without processing the first protection film 1015. At this time, since the upper surface and the side surfaces of the semiconductor layer 1014 are covered with the first protection film 1015, damage inflicted upon the semiconductor layer 1014 is at the time of formation of the electrode layer 1016 is suppressed. As a material of the electrode layer 1016, the above-described materials such as Ti, Al, and Mo are allowed to be used. Moreover, the electrode layer 1016 may be formed by stacking a plurality of different materials such as Ti/Al/Ti.

Figure 20A:
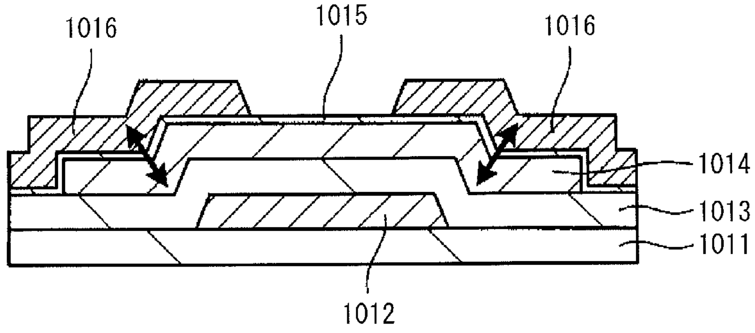
FIGS. 20A to 20C are diagrams illustrating further process steps of the method of manufacturing the thin film transistor illustrated in FIG. 18.

Next, as illustrated in FIG. 20A, etching is performed on the electrode layer 1016 to form an opening, thereby dividing the electrode layer 1016 to a right portion and a left portion with respect to the opening. At this time, since the upper side of the semiconductor layer 1014 is covered with the first protection film 1015, damage inflicted upon the semiconductor layer 1014 at the time of formation of the opening is suppressed. The conduction between the semiconductor layer 1014 and the electrode layers 1016 is established mainly near a portion indicated by arrows in the figure in the first protection film 1015. In addition, since the first protection film 1015 is a coarse film, leakage easily occurs due to the tunnel current and sufficient conduction is achievable.

Figure 20B:
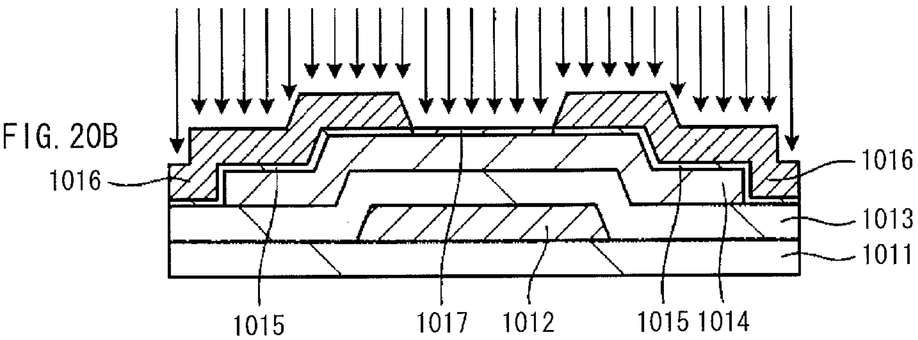

Next, as illustrated in FIG. 20B, oxygen-containing gas is used to perform plasma treatment or heat treatment. As a result, the damage inflicted in the semiconductor layer 1014 at the time of formation of the opening in the electrode layer 1016 is allowed to be recovered. In addition, oxygen is supplied to the first protection film 1015 under the opening in the electrode layer 1016 to oxidize only the portion corresponding to the opening of the first protection film 1015, and thus the first protection film 1015 at the corresponding portion is allowed to be changed to the dense second protection film 1017. In addition, damage of the semiconductor layer 1014 due to plasma and the like is suppressed by the second protection film 1017, and sufficient recovery effect of channel property is obtainable.

Figure 20C:
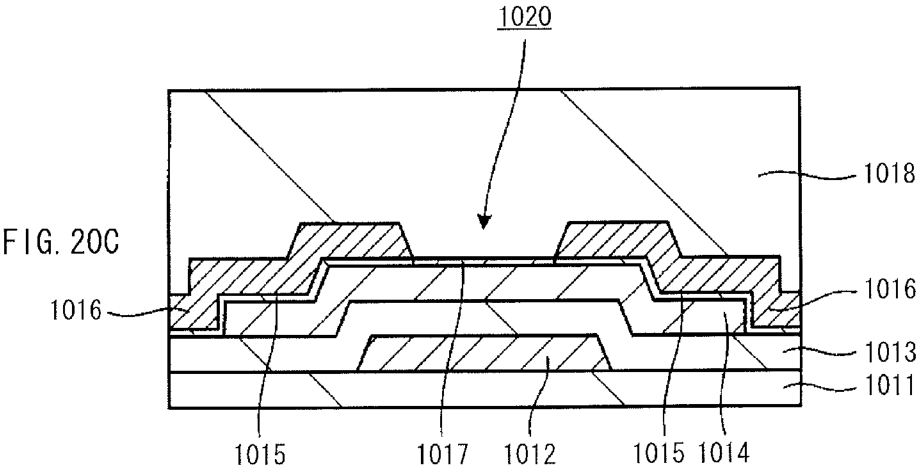

Next, as illustrated in FIG. 20C, a thick insulating layer 1018 is formed to cover the entire surface. The insulating layer 1018 is formed by, for example, CVD, sputtering, or coating. At this time, since the semiconductor layer 1014 is covered with the first protection film 1015 and the second protection film 1017, the damage inflicted upon the semiconductor layer 1014 is suppressed. In this way, the thin film transistor 1020 illustrated in FIG. 16 is manufactured.

According to the above-described configuration of the thin film transistor 1020 of the third embodiment, the first protection film 1015 that is a film formed of a coarse insulating material is formed between the semiconductor layer 1014 including a channel and the electrode layers 1016 that are to be the source-drain electrodes. In addition, the first protection film 1015 is formed to cover the upper surface and the side surfaces of the semiconductor layer 1014. Accordingly, the first protection film 1015, which is a film formed of a coarse insulating material, causes current leakage in the first protection film 1015. Therefore, the conduction between the semiconductor layer 1014 and the electrode layers 1016 with the first protection film 1015 in between is sufficiently realized. Moreover, the first protection film 1015 covers the upper surface and the side surfaces of the semiconductor layer 1014. Therefore, in the process of forming the electrode layer 1016 and in the process of processing the electrode layer 1016 to form the opening in manufacturing the thin film transistor 1020, the damage inflicted upon the semiconductor layer 1014 is suppressed.

Further, the second protection film 1017 that is a dense film compared with the first protection film 1015 is formed in a portion under the opening of the electrode layers 1016, namely, on the semiconductor layer 1014 in portions not facing the electrode layers 1016. Accordingly, the second protection film 1017 protects the semiconductor layer 1014 under the opening of the electrode layers 1016. In addition, since the second protection film 1017 is dense, the semiconductor layer 1014 in a portion under the second protection film 1017 is sufficiently insulated, and a portion between the left electrode layer 1016 and the right electrode layer 1016 is sufficiently insulated.

Moreover, according to the above-described configuration of the thin film transistor 1020 of the third embodiment and the above-described method of manufacturing the same, the first protection film 1015 covers the upper surface and the side surfaces of the semiconductor layer 1014, and the electrode layer 1016 is formed on the first protection film 1015 while the first protection film 1015 is provided over the entire surface. Therefore, the first protection film 1015 is not necessary to be processed before the formation of the electrode layer 1016, and damage to the semiconductor layer 1014 caused by processing of the protection film does not occur.

Then, the damage inflicted upon the semiconductor layer 1014 of the thin film transistor 1020 is suppressed so that deterioration of the characteristics of the thin film transistor due to the damage to the semiconductor layer 1014 is suppressed, and thus, it is possible to improve a manufacturing yield. In addition, since the first protection film 1015 is not necessary to be processed, the process of processing the protection film is eliminated. As a result, it is possible to reduce the number of manufacturing processes compared with an existing configuration.

The thin film transistor according to the technology such as the thin film transistor 1020 of the third embodiment is allowed to be used in various kinds of displays, as a drive transistor to drive a display device. Examples of the display to which the thin film transistors according to the embodiments of the technology are applicable include, without limitation, a liquid crystal display (LCD) and an organic EL display (OELD). In addition, the thin film transistors according to the embodiments of the technology may be applicable to display and the like using a display device such as an electro deposition display device and an electro chromic display device. Moreover, application is not limited to a display (such as a television and a monitor) displaying an image, and the technology is applicable to an apparatus including a display section. Examples of the apparatus including a display section include, without limitation, a notebook personal computer, a video camera, and a mobile phone.

Subsequently, an embodiment in which any of the thin film transistors of the embodiments of the technology is applied to a display will be described below.

Fourth Embodiment

Display

Figure 21A:
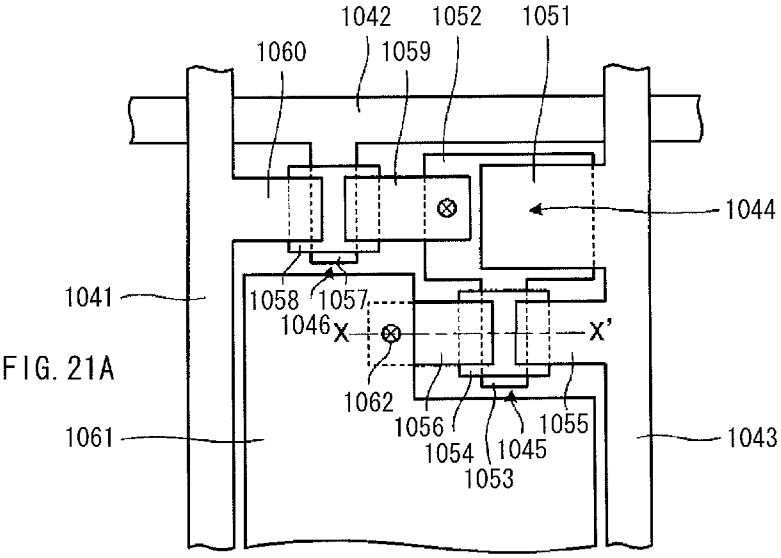
FIGS. 21A and 21B are diagrams each illustrating a schematic configuration of a display according to a fourth embodiment of the disclosure.
Figure 21B:
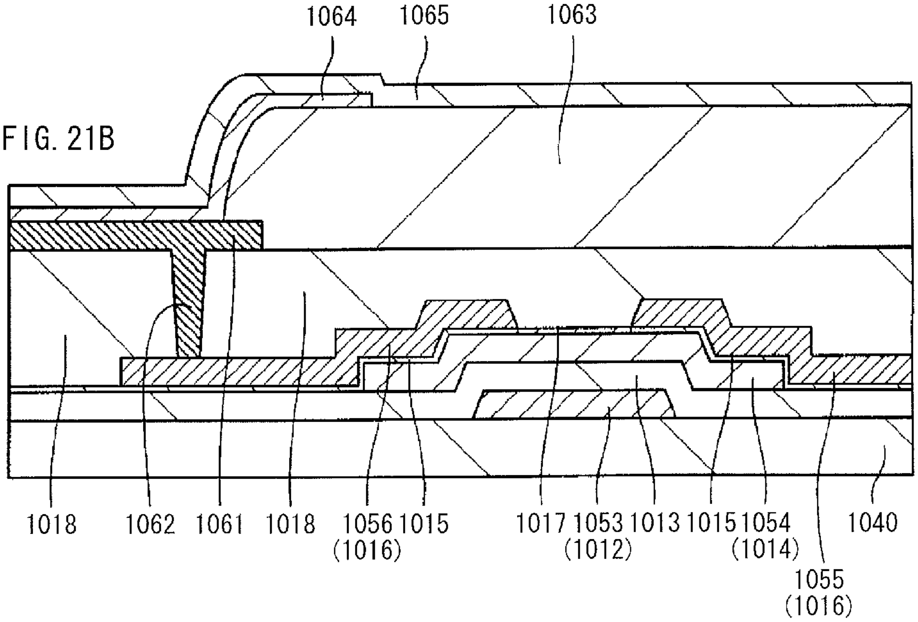

FIGS. 21A and 21B each illustrate a schematic structure of a display according to a fourth embodiment. FIG. 21A is a plan view of a main part of one pixel in the display, and FIG. 21B is a sectional diagram taken along X-X' in FIG. 21A. The display of the fourth embodiment has a configuration in which any of the thin film transistors of the embodiments of the technology is applied to an organic EL display (OELD) using a light emitting device configured of an organic EL device as a display device.

As illustrated in FIG. 21A, a pixel is arranged in a region surrounded by a source line 1041, a gate line 1042, and a power line 1043. The pixel includes a first electrode layer 1061, a capacitor 1044, and two thin film transistors 1045 and 1046. The capacitor 1044 has a dielectric film (not illustrated) that is formed in an upper electrode 1051, in a lower electrode 1052, and in a gap between the electrodes 1051 and 1052. The first thin film transistor 1045 includes a gate electrode 1053, a semiconductor layer 1054 formed of an oxide semiconductor, and electrode layers 1055 and 1056. The right electrode layer 1055 is connected to the power line 1043, and the left electrode layer 1056 is connected to the first electrode layer 1061 through a contact portion 1062. The gate electrode 1053 is connected to the lower electrode 1052 of the capacitor 1044. The second thin film transistor 1046 includes a gate electrode 1057, a semiconductor layer 1058 formed of an oxide semiconductor, and electrode layers 1059 and 1060. The right electrode layer 1059 is connected to the lower electrode 1052 of the capacitor 1044, and the left electrode layer 1060 is connected to the source line 1041. The gate electrode 1057 is connected to the gate line 1042. The first electrode layer 1061 is an electrode configuring a light emitting device configured of an organic EL device. The first thin film transistor 1045 and the second thin film transistor 1046 drive the light emitting device.

Any of the thin film transistors of the embodiments of the technology such as the thin film transistor 1020 of the third embodiment is allowed to be used as the first thin film transistor 1045 and the second thin film transistor 1046. In the display of the present embodiment, any of the thin film transistors of the embodiments of the technology is applied to one or both of the first thin film transistor 1045 and the second thin film transistor 1046.

FIG. 21B is a sectional diagram of a configuration in which the thin film transistor of the third embodiment is applied to the first thin film transistor 1045 of FIG. 21A. The reference numerals of the components in FIG. 21A and the reference numerals of the components in FIG. 18 are used in FIG. 21B to designate components. The contact portion 1062 connecting the first electrode layer 1061 to the left electrode layer 1056 (1016) of the thin film transistor is formed of a conductive layer embedded in the insulating layer 1018. The first electrode layer 1016 is formed on a flattened surface of the insulating layer 1018. A wall 1063 formed of an insulating body is formed on the insulating layer 1018 to cover a right end of the first electrode layer 1061. An electroluminescence layer 1064 is formed from on the first electrode 1061 to the wall 1063. The second electrode layer 1065 is formed to cover the electroluminescence layer 1064. The three layers of the first electrode layer 1061, the electroluminescence layer 1064, and the second electrode layer 1065 configure the light emitting device.

The electroluminescence layer 1064 is configured of an organic material layer containing a luminescent organic compound. The electroluminescence layer 1064 may be configured of a single-layer organic material layer or a multi-layer organic material layer. For the first electrode layer 1061, for example, materials with a small work function, such as Ca, Al, CaF, MgAg, AlLi are allowed to be used. For the second electrode layer 1065, transparent conductive materials such as indium tin oxide (ITO) are allowed to be used. For the wall 1063, for example, an organic resin film, an inorganic insulating film, and organic polysiloxane are allowed to be used.

When a voltage is applied between the first electrode layer 1061 and the second electrode layer 1065 in a portion where the three layers of the first electrode layer 1061, the electroluminescence layer 1064, and the second electrode layer 1065 are stacked, the electroluminescence layer 1064 emits light.

Note that the insulating layer 1018 of FIG. 21B is not limited to only a single insulating layer formed of the same insulating material, and may be configured of a plurality of insulating layers formed of different insulating materials.

Figure 22:
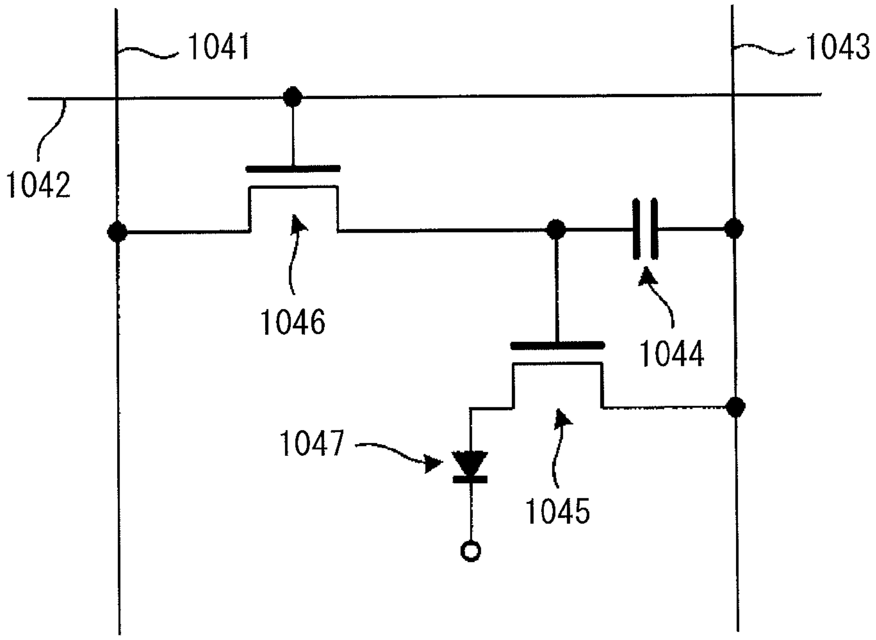
FIG. 22 is an equivalent circuit diagram of a pixel in the display of the fourth embodiment.

FIG. 22 is an equivalent circuit diagram of one pixel of the display having the configuration illustrated in FIGS. 21A and 21B. One of a source and a drain of the first thin film transistor 1045 is connected to a light emitting device 1047. The light emitting device 1047 of FIG. 22 is configured of three layers of the first electrode layer 1061, the electroluminescence layer 1064, and the second electrode layer 1065 of FIG. 21B.

According to the configuration of the display of the above-described fourth embodiment, any of the thin film transistors of the embodiments of the technology is applied to one or both of the first thin film transistor 1045 and the second thin film transistor 1046. As a result, in the thin film transistor, conduction between the semiconductor layer and the electrode layer is established, and other parts of the semiconductor layer are sufficiently protected and insulated. Therefore, the damage inflicted upon the semiconductor layer is suppressed in manufacturing, the reliability of the display is improved, and the display is manufactured with a high yield.

The display using any of the above-described thin film transistors 10A, 10B and 1020 is applicable to, for example, electronic apparatuses as described below. Examples of the electronic apparatuses include, without limitation, a television, a digital camera, a notebook personal computer, mobile terminal devices such as a mobile phone, and a video camera. In other words, the above-described display is applicable to electronic apparatuses in various fields that display an externally input image signal or an internally generated image signal as an image or a picture.

[Module]

Figure 23:
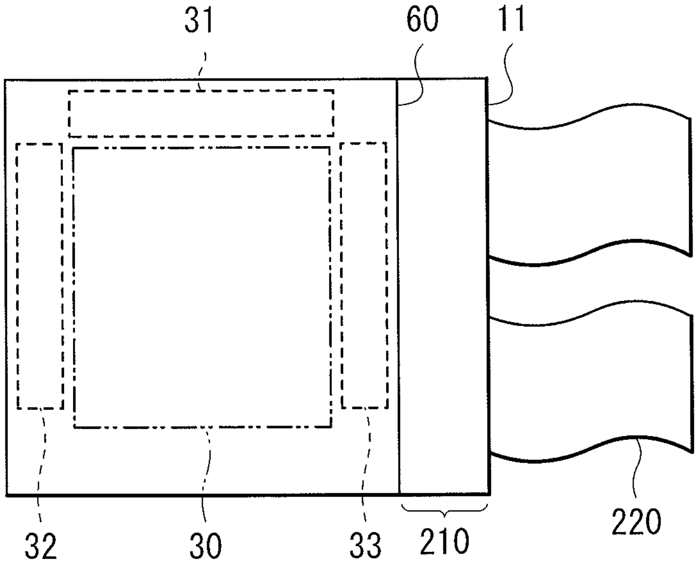
FIG. 23 is a plan view illustrating a schematic configuration of a module that includes the display illustrated in FIG. 16 and FIG. 21.

The above-described display is incorporated in various kinds of electronic apparatuses such as those according to application examples 1 to 6 described below, as a module illustrated in FIG. 23, for example. In the module, for example, a region 210 that is exposed from a sealing substrate 60 is provided on one side of the substrate 11, and wirings of the horizontal selector 31, the write scanner 32, and the power scanner 33 are extended to configure an external connection terminal (not illustrated) in the exposed region 210. The external connection terminal may be provided with a flexible printed circuit (FPC) 220 for inputting and outputting signals.

Application Example 1

Figure 24:
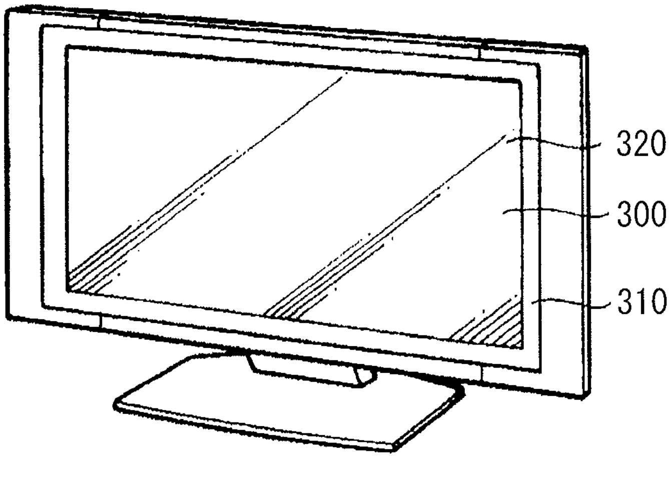
FIG. 24 is a perspective view illustrating an appearance of an application example 1.

FIG. 24 illustrates an appearance of a television. The television includes, for example, an image display screen section 300 including a front panel 310 and a filter glass 320, and the image display screen section 300 corresponds to the above-described display.

Application Example 2

Figure 25A:
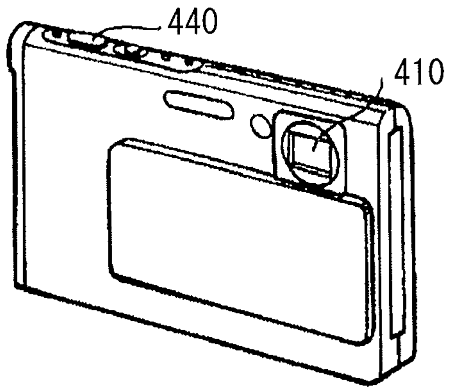
FIG. 25A is a perspective view illustrating an appearance of an application example 2 viewed from a front side thereof.
Figure 25B:
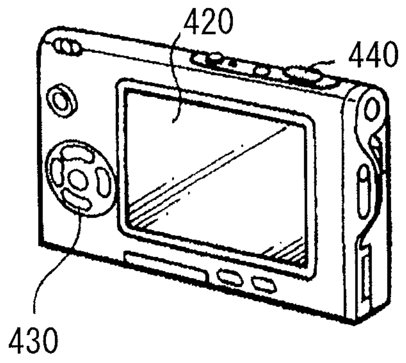
FIG. 25B is a perspective view illustrating the appearance of the application example 2 viewed from a back side thereof.

FIGS. 25A and 25B each illustrate an appearance of a digital camera. The digital camera includes, for example, a light emitting section 410 for generating flash light, a display section 420, a menu switch 430, and a shutter button 440. The display section 420 corresponds to the above-described display.

Application Example 3

Figure 26:
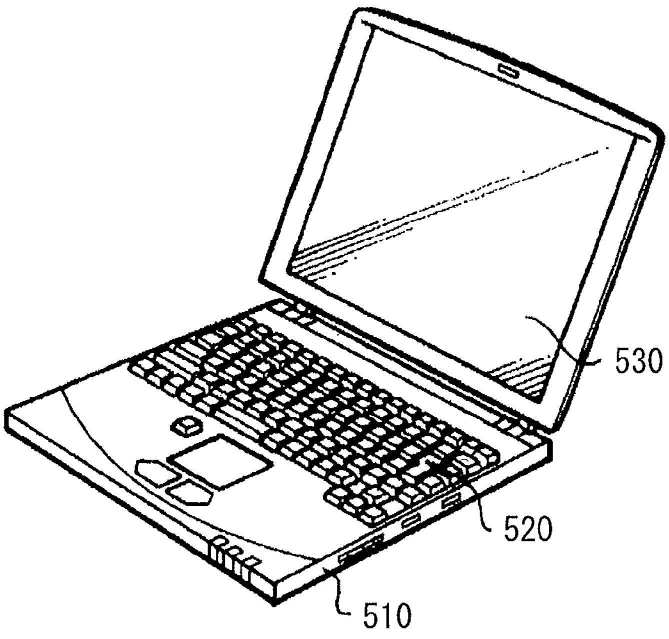
FIG. 26 is a perspective view illustrating an appearance of an application example 3.

FIG. 26 illustrates an appearance of a notebook personal computer. The notebook personal computer includes, for example, a main body 510, a keyboard 520 for inputting letters and the like, and a display section 530 displaying an image. The display section 530 corresponds to the above-described display.

Application Example 4

Figure 27:
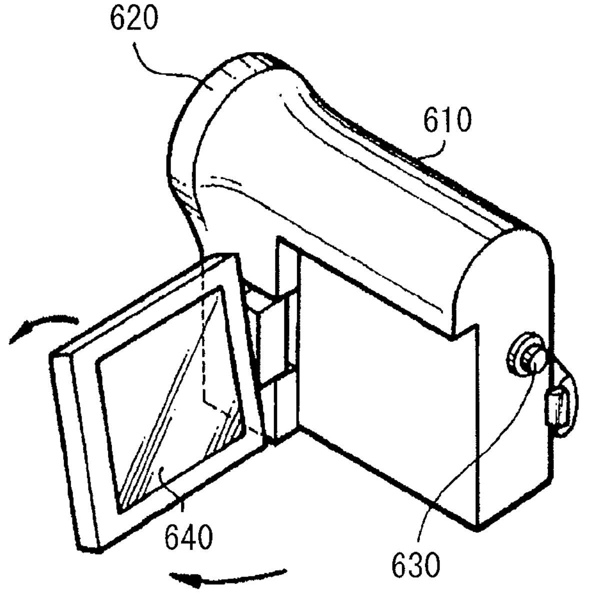
FIG. 27 is a perspective view illustrating an appearance of an application example 4.
Figures 28A, 28B, 28C, 28D, 28E, 28F, 28G:
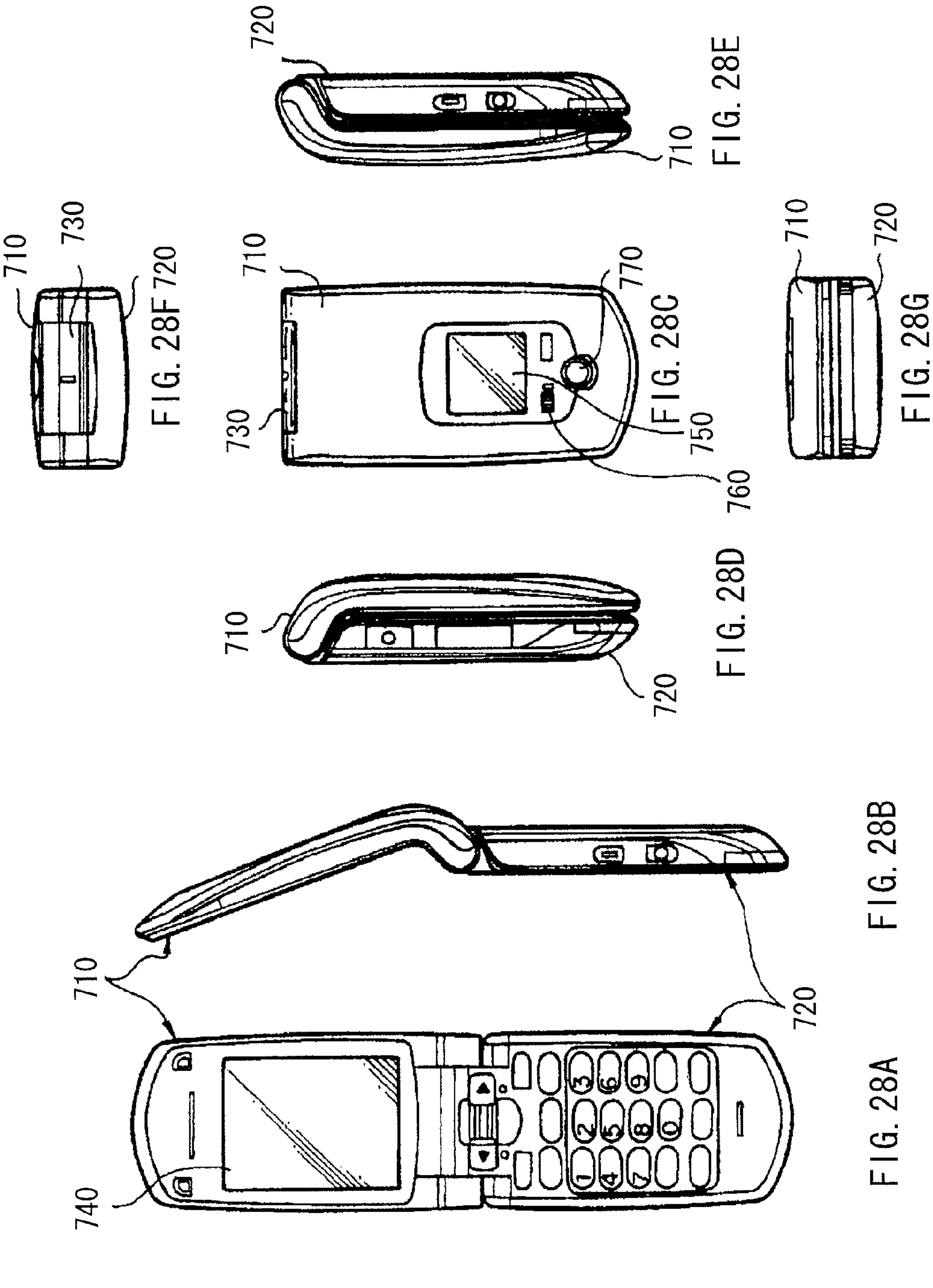
FIG. 28A is a front view of an application example 5 in an open state.
FIG. 28B is a side view thereof.
FIG. 28C is a front view of the application example 5 in a closed state.
FIG. 28D is a left side view.
FIG. 28E is a right side view.
FIG. 28F is a top view.
FIG. 28G is a bottom view.

FIG. 27 illustrates an appearance of a video camera. The video camera includes, for example, a main body section 610, a lens 620 which is provided on a front side of the main body section 610 and configured to take an image of a subject, a start-stop switch 630 which is used when taking an image, and a display section 640. The display section 640 corresponds to the above-described display.

Application Example 5

FIGS. 28A to 28G each illustrate an appearance of a mobile phone. The mobile phone is configured by connecting, for example, an upper housing 710 and a lower housing 720 with a connecting section (a hinge section) 730, and includes a display 740, a sub display 750, a picture light 760, and a camera 770. Among these components, the display 740 or the sub display 750 corresponds to the above-described display.

Application Example 6

Figure 29A:
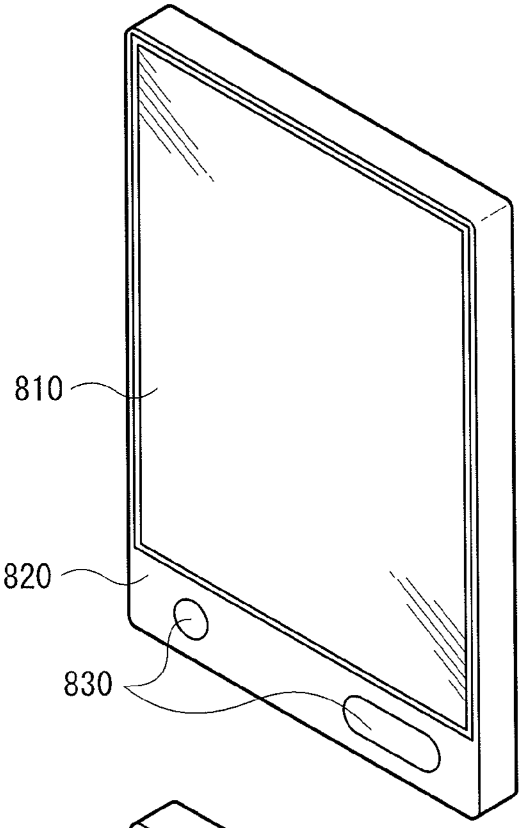
FIGS. 29A and 29B are perspective views each illustrating an appearance of an application example 6.
Figure 29B:
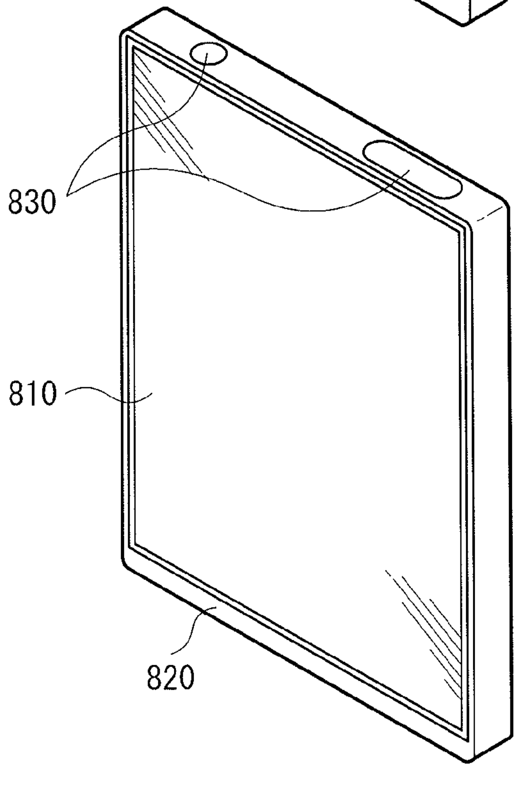

FIGS. 29A and 29B each illustrate an appearance of a smartphone. The smartphone includes, for example, a display section 810, a non-display section (a housing) 820, and an operation section 830. The operation section 830 may be provided on a front surface of the non-display section 820 as illustrated in FIG. 29A, or may be provided on a top surface as illustrated in FIG. 29B.

Hereinbefore, although the disclosure has been provided with referring to the embodiments, the modifications, and the application examples, the disclosure is not limited to these, and various modifications may be made. For example, in the embodiments, the modifications, and the application examples, the thin film transistor having the bottom gate structure has been described as an example. However, the thin film transistor of the disclosure may be a thin film transistor having a top gate structure.

In addition, in the embodiments, the modifications, and the application examples, the case where the wiring contact portion between the source-drain electrodes and the gate wiring layer is provided has been exemplified. However, the wiring contact portion may not be provided. For example, in an organic EL display, the wiring contact portion is provided, whereas in a liquid crystal display, the wiring contact portion is not provided in many cases.

Further, the structure of the thin film transistor of the disclosure is not limited to the multi-layer structure described in the embodiments, the modifications, and the application examples, and the material, the thickness, the manufacturing process, and the like of each of the layers are not limited to those described above.

The first to fourth embodiments and the modification thereof can be individually practiced. In addition, the embodiments and the modifications described above can be combined unless any contributions occur. For example, some applications of the technology may practice any of: a combination of the first embodiment or the modification thereof with the second embodiment; a combination of the first embodiment or the modification thereof with the third embodiment or the modification thereof; a combination of the first embodiment or the modification thereof with the fourth embodiment or the modification thereof; a combination of the second embodiment with the third embodiment or the modification thereof; a combination of the second embodiment with the fourth embodiment or the modification thereof; and a combination of the third embodiment or the modification thereof with the fourth embodiment or the modification thereof. Such combination can be practiced as any of the module and the application examples 1 to 6. In this case, farther synergetic effects are exhibited.

Note that the disclosure may be configured as follows.

(1) A thin film transistor including:

a gate electrode, a source electrode, and a drain electrode;

an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

(2) The thin film transistor according to (1), wherein the oxide semiconductor layer and the low resistance oxide layer are provided on the gate electrode with the insulating film in between, and the source electrode and the drain electrode are provided on the low resistance oxide layer.

(3) The thin film transistor according to (1) or (2), wherein the oxide semiconductor layer and the low resistance oxide layer are formed of a same oxide material.

(4) The thin film transistor according to any one of (1) to (3), wherein the low resistance oxide layer has an amorphous state, and the oxide semiconductor layer has a crystallized state.

(5) The thin film transistor according to any one of (1) to (4), wherein the oxide material is resistant to a chemical solution used in patterning the source electrode and the drain electrode.

(6) The thin film transistor according to any one of (1) to (5), wherein the insulating film has a through hole on a wiring layer, the wiring layer being provided in a same layer as the gate electrode, and a part of the low resistance oxide layer covers an inside of the through hole.

(7) The thin film transistor according to (6), wherein the source electrode or the drain electrode is provided on the through hole with the low resistance oxide layer in between, and is electrically connected to the wiring layer.

(8) The thin film transistor according to any one of (1) to (7), further including a protection film that covers the oxide semiconductor layer, the source electrode, and the drain electrode.

(9) The thin film transistor according to (8), wherein the protection film is formed of one of silicon oxide (SiOx) and aluminum oxide (AlOx).

(10) A method of manufacturing a thin film transistor, the method including:

forming each of a gate electrode, a source electrode, and a drain electrode; and forming an oxide semiconductor layer, the oxide semiconductor layer being provided on one side of the gate electrode with an insulating film in between, the oxide semiconductor layer being provided in a region not facing the source electrode and the drain electrode and being electrically connected to the source electrode and the drain electrode, the forming the oxide semiconductor layer including forming a low resistance oxide layer, the low resistance oxide layer being provided in a region facing the source electrode and in a region facing the drain electrode, the regions being adjacent to the oxide semiconductor layer, and the low resistance oxide layer having an electric resistivity lower than an electric resistivity of the oxide semiconductor layer.

(11) The method according to (10), wherein the oxide semiconductor layer is formed by:

forming, after the gate electrode is formed, an oxide film on the gate electrode with the insulating film in between, a part of the oxide film corresponding to the low resistance oxide layer;

forming the source electrode and the drain electrode on the formed oxide film; and performing, after the source electrode and the drain electrode are formed, a resistance-increasing treatment on a selective region exposed from the source electrode and the drain electrode of the oxide film.

(12) The method according to (11), wherein the resistance-increasing treatment includes a heat treatment performed under oxygen atmosphere.

(13) The method according to (11) or (12), further including forming, after the source electrode and the drain electrode are formed, a protection film under oxygen atmosphere, the forming the protection film performing the resistance-increasing treatment by exposing the selective region of the oxide film to the oxygen atmosphere.

(14) The method according to (13), wherein the protection film includes one of a film of silicon oxide (SiOx) and a film of aluminum oxide (AlOx).

(15) The method according to any one of (11) to (14), further including forming a through hole on a wiring layer in the insulating layer, the wiring layer being provided in a same layer as the gate electrode, wherein the oxide film is formed to cover an inside of the through hole.

(16) A display with a thin film transistor, the thin film transistor including:

a gate electrode, a source electrode, and a drain electrode;

an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

(17) An electronic apparatus with a display, the display being provided with a thin film transistor, the thin film transistor including:

a gate electrode, a source electrode, and a drain electrode;

an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer.

(18) A thin film transistor including:

a gate electrode;

a semiconductor layer including an oxide semiconductor and forming a channel;

a gate insulating layer provided between the gate electrode and the semiconductor layer;

an electrode layer serving as source-drain electrodes of the transistor;

a first protection film provided between the semiconductor layer and the electrode layer, the first protection film including a coarse insulating material; and a second protection film provided in contact with a portion of the semiconductor layer, the portion not facing the electrode layer, and the second protection film including an insulating material that is more dense than the coarse insulating material of the first protection film.

(19) The thin film transistor according to (18), wherein the first protection film is provided to cover an upper surface and side surfaces of the semiconductor layer.

(20) A display with a display device and a thin film transistor that drives the display device, the thin film transistor including:

a gate electrode;

a semiconductor layer including an oxide semiconductor and forming a channel;

a gate insulating layer provided between the gate electrode and the semiconductor layer;

an electrode layer serving as source-drain electrodes of the transistor;

a first protection film provided between the semiconductor layer and the electrode layer, the first protection film including a coarse insulating material; and a second protection film provided in contact with a portion of the semiconductor layer, the portion not facing the electrode layer, and the second protection film including an insulating material that is more dense than the coarse insulating material of the first protection film.

The present application contains subject matter related to that disclosed in Japanese Priority Patent Application JP 2012-003211 filed in the Japan Patent Office on Jan. 11, 2012 and Japanese Priority Patent Application JP 2012-026250 filed in the Japan Patent Office on Feb. 9, 2012, the entire content of each of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A thin film transistor comprising:

a gate electrode, a source electrode, and a drain electrode;

an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer, wherein the oxide semiconductor layer and the low resistance oxide layer are provided on the gate electrode with the insulating film in between, wherein the source electrode and the drain electrode are provided on the low resistance oxide layer, wherein the insulating film has a through hole on a wiring layer, the wiring layer being provided in a same layer as the gate electrode, and wherein a part of the low resistance oxide layer covers an inside of the through hole.

2. The thin film transistor according to claim 1, wherein the oxide semiconductor layer and the low resistance oxide layer are formed of a same oxide material.

3. The thin film transistor according to claim 2, wherein the low resistance oxide layer has an amorphous state, and the oxide semiconductor layer has a crystallized state.

4. The thin film transistor according to claim 2, wherein the oxide material is resistant to a chemical solution used in patterning the source electrode and the drain electrode.

5. The thin film transistor according to claim 1, wherein the source electrode or the drain electrode is provided on the through hole with the low resistance oxide layer in between, and is electrically connected to the wiring layer.

6. The thin film transistor according to claim 1, further comprising a protection film that covers the oxide semiconductor layer, the source electrode, and the drain electrode.

7. The thin film transistor according to claim 6, wherein the protection film is formed of one of silicon oxide (SiOx) and aluminum oxide (AlOx).

8. A display with a thin film transistor, the thin film transistor comprising:

agate electrode, a source electrode, and a drain electrode;

an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer, wherein the oxide semiconductor layer and the low resistance oxide layer are provided on the gate electrode with the insulating film in between, wherein the source electrode and the drain electrode are provided on the low resistance oxide layer, wherein the insulating film has a through hole on the wiring layer, the wiring layer being provided in the same layer as the gate electrode, and wherein a part of the low resistance oxide layer covers an inside of the through hole.

9. The display with a thin film transistor according to claim 8, wherein the oxide semiconductor layer and the low resistance oxide layer are formed of a same oxide material.

10. The display with a thin film transistor according to claim 9, wherein the low resistance oxide layer has an amorphous state, and the oxide semiconductor layer has a crystallized state.

11. The display with a thin film transistor according to claim 9, wherein the oxide material is resistant to a chemical solution used in patterning the source electrode and the drain electrode.

12. The display with a thin film transistor according to claim 8, wherein the source electrode or the drain electrode is provided on the through hole with the low resistance oxide layer in between, and is electrically connected to the wiring layer.

13. The display with a thin film transistor according to claim 8, further comprising a protection film that covers the oxide semiconductor layer, the source electrode, and the drain electrode.

14. The display with a thin film transistor according to claim 13, wherein the protection film is formed of one of silicon oxide (SiOx) and aluminum oxide (AlOx).

15. An electronic apparatus with a display, the display being provided with a thin film transistor, the thin film transistor comprising:

a gate electrode, a source electrode, and a drain electrode;

an oxide semiconductor layer provided on one side of the gate electrode with an insulating film in between, the oxide semiconductor layer being provided in a region not facing the source electrode and the drain electrode and being electrically connected to the source electrode and the drain electrode; and a low resistance oxide layer provided in a region facing the source electrode and in a region facing the drain electrode, the regions being adjacent to the oxide semiconductor layer, and the low resistance oxide layer having an electric resistivity lower than an electric resistivity of the oxide semiconductor layer, wherein the oxide semiconductor layer and the low resistance oxide layer are provided on the gate electrode with the insulating film in between, wherein the source electrode and the drain electrode are provided on the low resistance oxide layer, wherein the insulating film has a through hole on the wiring layer, the wiring layer being provided in the same layer as the gate electrode, and wherein a part of the low resistance oxide layer covers an inside of the through hole.

16. The electronic apparatus with a display according to claim 15, wherein the oxide semiconductor layer and the low resistance oxide layer are formed of a same oxide material.

17. The electronic apparatus with a display according to claim 16, wherein the low resistance oxide layer has an amorphous state, and the oxide semiconductor layer has a crystallized state.

18. The electronic apparatus with a display according to claim 16, wherein the oxide material is resistant to a chemical solution used in patterning the source electrode and the drain electrode.

19. The electronic apparatus with a display according to claim 15, wherein the source electrode or the drain electrode is provided on the through hole with the low resistance oxide layer in between, and is electrically connected to the wiring layer.

20. The electronic apparatus with a display according to claim 15, further comprising a protection film that covers the oxide semiconductor layer, the source electrode, and the drain electrode.

* * * * *